(12) United States Patent
Boggs et al.

(10) Patent No.: US 11,308,113 B1
(45) Date of Patent: Apr. 19, 2022

(54) SYSTEM AND METHOD FOR MANAGING COGNATE SPECIFICATIONS OF GOODS

(71) Applicant: Edgewood Software Corp., Cincinnati, OH (US)

(72) Inventors: David Boggs, Cincinnati, OH (US); James Orr, Cincinnati, OH (US); Thomas Vaughan, Pucon (CL)

(73) Assignee: Edgewood Software Corp., Cincinnati, OH (US)

(*) Notice: Subject to any disclaimer, the term of this patent is extended or adjusted under 35 U.S.C. 154(b) by 172 days.

(21) Appl. No.: 16/893,581

(22) Filed: Jun. 5, 2020

Related U.S. Application Data

(60) Provisional application No. 62/867,335, filed on Jun. 27, 2019.

(51) Int. Cl.
| | |
|---|---|
| *G06F 16/00* | (2019.01) |
| *G06F 16/25* | (2019.01) |
| *G06Q 50/04* | (2012.01) |
| *G06F 30/10* | (2020.01) |
| *G06F 16/22* | (2019.01) |
| *G06Q 10/04* | (2012.01) |

(52) U.S. Cl.
CPC ........ *G06F 16/252* (2019.01); *G06F 16/2255* (2019.01); *G06F 30/10* (2020.01); *G06Q 10/043* (2013.01); *G06Q 50/04* (2013.01)

(58) Field of Classification Search
CPC .............. G06F 16/30; G06F 16/2365; G06F 16/24545; G06F 16/24554
See application file for complete search history.

(56) References Cited

U.S. PATENT DOCUMENTS

| | | | | |
|---|---|---|---|---|
| 5,070,456 | A * | 12/1991 | Garneau | G09G 1/00 704/8 |
| 2013/0332608 | A1* | 12/2013 | Shiga | G06F 9/5088 709/226 |
| 2014/0282391 | A1* | 9/2014 | Doughan | G06F 9/4488 717/116 |

(Continued)

OTHER PUBLICATIONS

"Compound Keys Encoded into Scalars." https://datomic.narkive.com/52y5ggF9/compound-keys-encoded-into-scalars. Accessed online Sep. 23, 2020.

(Continued)

*Primary Examiner* — Cheryl Lewis
(74) *Attorney, Agent, or Firm* — Frost Brown Todd LLC

(57) ABSTRACT

A cognate specification system manages and enforces digital, canonical representations of entities that are added to and in the system by creating a composite entity key ("EntityKey") that uniquely and immutably identifies each entity within the system, and that is created based upon the attributes of the entity rather than being arbitrarily assigned. Entities may be organized into various types or cognates, each associated with distinct sets of attributes. A physical or digital referent may be added to the system as an entity by specifying attributes. In such a system, any entity, whether a physical or digital referent, a process, or other type, is uniquely and verifiably identifiable, and may be linked to or associated with other entities, allowing users of the system to produce and access specification granularity beyond traditional approaches focused on systems interoperability.

30 Claims, 16 Drawing Sheets

(56) References Cited

U.S. PATENT DOCUMENTS

2014/0344542 A1* 11/2014 Huang ................. G06F 16/907
　　　　　　　　　　　　　　　　　　　　　　711/164

OTHER PUBLICATIONS

Roberto Di Cosmo, Morane Gruenpeter, Stefano Zacchiroli. Identifiers for Digital Objects: The Case of Software Source Code Preservation. iPRES 2018—15th International Conference on Digital Preservation, Sep. 2018, Boston, United States, pp. 1-9, ff10. 17605/OSF.IO/KDE56ff. ffhal-01865790v4f.

* cited by examiner

Material Variant Row (330)

| EntityID | 4739210 |
|---|---|
| UserID | [tom vaughan] |
| CompanyID | [acme] |
| Alias | [spencer] |
| MaterialType | [adhesive] |
| MaterialVariant$_n$ | [water][starch][sodium-hydroxide] |
| Ratio$_n$ | [0.88][0.10][0.20] |
| ProcessAction$_n$ | [mix][cook] |
| EntityKey | [c724a402dd6f79469ce644f593d7d897] |

Material Item Row (332)

| EntityID | 48432001 |
|---|---|
| UserID | [tom vaughan] |
| CompanyID | [acme] |
| Alias | [spencer-i1] |
| MaterialVariant | [4739210] |
| ProcessMethod$_n$ | [agitated-counter-flow] [pressurized-thermal-energy] |
| MaterialForm[1] | [1] |
| EntityKey | [869d9ea400a7bded5dee06f5dec1f986] |

FIG. 3B

SYSTEM AND METHOD FOR MANAGING COGNATE SPECIFICATIONS OF GOODS

PRIORITY

This application is a non-provisional filing of U.S. Provisional Patent 62/867,335, filed Jun. 27, 2019, and titled "System and Method for Managing Cognate Specifications of Goods," the entire disclosure of which is hereby incorporated by reference herein.

FIELD

The disclosed technology pertains to a system for creating and managing cognate specifications of goods and associated processes.

BACKGROUND

Some businesses utilize a system of record ("SOR") that contains descriptions and specifications about the products they buy, manufacture, and sell. Some such businesses may utilize multiple SORs concurrently, with some being specialized for certain product lines or for use with certain customers or vendors. Some SORs are architected according to the relational data model and utilize a relational database management system ("RDBMS") to manage those records and store them in a database. Many such SORs are designed to efficiently identify, retrieve, and update records.

As an example, a relational record can be depicted as a single row, sometimes called a tuple, in a table of rows and columns. The columns, sometimes called headers, can refer to attributes of something in the physical world, such as a product. Each intersection of row and column in a tuple can serve to capture a supposed fact about a product in the form of an attribute-value pair. Some columns may contain key values (e.g., a primary key) that uniquely identify associated data, and can be used to relate data between tables. Other columns may contain values that correspond to that tuple's attribute-value pair, and can be updated and changed through statements or queries submitted to the database.

As an example, a company that manufactures different products often refers to each product as an item and as such the company may record all of their items as rows in an item table. In this example, an item's identity could be represented by pairing a column header or attribute name (e.g. id, short for identity or identifier) and the value recorded at the row-column intersection, perhaps a random or sequenced integer auto generated by the system (e.g. 4739210). Continuing the above example, when dealing with customers and vendors, the company may refer to one of the physical items the company manufactures, the referent, as 4739210, rather than describing it by its full name, description, features, or other text descriptors. Such an id may be designated as a primary key in a database table describing physical items, thus making the value 4739210 uniquely identifiable across one or more tables of the database.

As illustrated above, identifiers can be arbitrarily (e.g., sequentially, randomly) assigned to referents. As an example, the value 4739210 does not inherently describe the physical item, but may be identifiable as a unique identifier that can be used to gain additional context for the physical item (e.g., by selecting or querying the appropriate table or tables). However, digital identifiers and referents are not the same thing. Differences between physical products, even physical products of the same kind, can be numerous, diverse, and subtle, all at the same time. And while identifying physical products through observation and measurement in order to discern them from others may be somewhat routine, albeit time consuming, for humans, especially those skilled in the domain, it is quite another matter to architect the same level of discernment into a reliable, relational data model. As a result, designing or redesigning a conceptual or logical, relational data model that captures digital, canonical representations of physical products in the form of attribute names in database tables is not intuitive.

Contributing to this difficulty is the reality that SORs may be designed to meet the needs of particular business silos or company departments such as product design, purchasing, sales, and others. This practice can create ambiguity about referents since product attribute names tend to be department-centric and not product-centric. For instance, an attribute-value pair such as supplier-ACME may provide a meaningful fact to someone in the purchasing department, but "ACME" carries no direct, inherent meaning about a referent's "itemness" (e.g., the thing or things that make it different from other items). Attribute names like description may provide some utility for capturing referent differences via free-form text input, but it is left up to system users to record those differences as they see them, often in the absence of any standard and without any mechanism to prevent duplicate records. Even in cases where attribute names or column headers may be expertly and succinctly assigned, RDBMSs still treat real world objects as if they were somehow mutable, allowing users to mutate the attribute or column header values in records that refer to those objects. As a result, a single referent may be recorded across the various data environments of an organization multiple times, with some records being true duplicates, and others having variations or identification anomalies.

The ambiguity can worsen as products cross company boundaries. Continuing the above example, the referent of 4739210 in one company's database item table, upon being shipped to and received by another company, is often assigned a different id and a different description, and recorded in a database table named something other than item. Both companies may use cross referencing to alleviate ambiguity, but commerce is dynamic and these links often break and require substantial maintenance to keep them up to date and reliable. Even where standards exist and participants follow the standards, the curators of standards can unintentionally undermine their own standards and unwittingly create identification anomalies. The retail UPC code or GTIN is a good example. In some cases, companies can increase or decrease package sizes of their products by amounts of up to twenty percent, and subsequently continue selling the resized products under the same UPC codes assigned before the changes took place.

While conventional implementations and uses of relational models as described above are useful, they do not inherently cast product and process data into standard blocks of useful, digital assets that have the same meaning from system to system and from company to company. Over time, such conventional approaches to systems architecture have contributed significantly to the heterogeneous data environment that has become the norm. As a result, the cost to manage and exchange data between discrete systems has grown which, in the context of manufacturing goods, impacts the cost, speed, efficiency, and accuracy with which goods can be requested, produced, and delivered. Application programming interfaces and other data interfaces can provide at least an outward appearance of interoperability between systems, but such approaches ultimately rely on statically configured conversions which must be maintained over time. Changes in interfaces and data are often not communicated to outside parties prior to implementation, meaning that the need to update an interface is not discovered until a software application that relies upon the interface fails. Additionally, changes in interfaces and data made to accommodate one consuming party's needs may break or render the interface and data obsolete for another consuming party.

There is a need for an improved SOR that includes features to address one or more of the above.

BRIEF DESCRIPTION OF THE DRAWINGS

The drawings and detailed description that follow are intended to be merely illustrative and are not intended to limit the scope of the invention as contemplated by the inventors.

FIG. 3B is a schematic diagram showing exemplary data from the dataset of FIG. 3A;

DETAILED DESCRIPTION

The inventors have conceived of novel technology that, for the purpose of illustration, is disclosed herein as applied in the context of management of cognate specifications. While the disclosed applications of the inventors' technology satisfy a long-felt but unmet need in the art of management of cognate specifications, it should be understood that the inventors' technology is not limited to being implemented in the precise manners set forth herein, but could be implemented in other manners without undue experimentation by those of ordinary skill in the art in light of this disclosure. Accordingly, the examples set forth herein should be understood as being illustrative only, and should not be treated as limiting.

An improved SOR may implement features that allow for one or more of a homogeneous data model, provision of common identification and record immutability, and accommodation of canonical, digital representations of referents and their utility in extending a single platform as an alternative to systems interoperability, which relies upon pre-configured communication interfaces.

Figure 1:
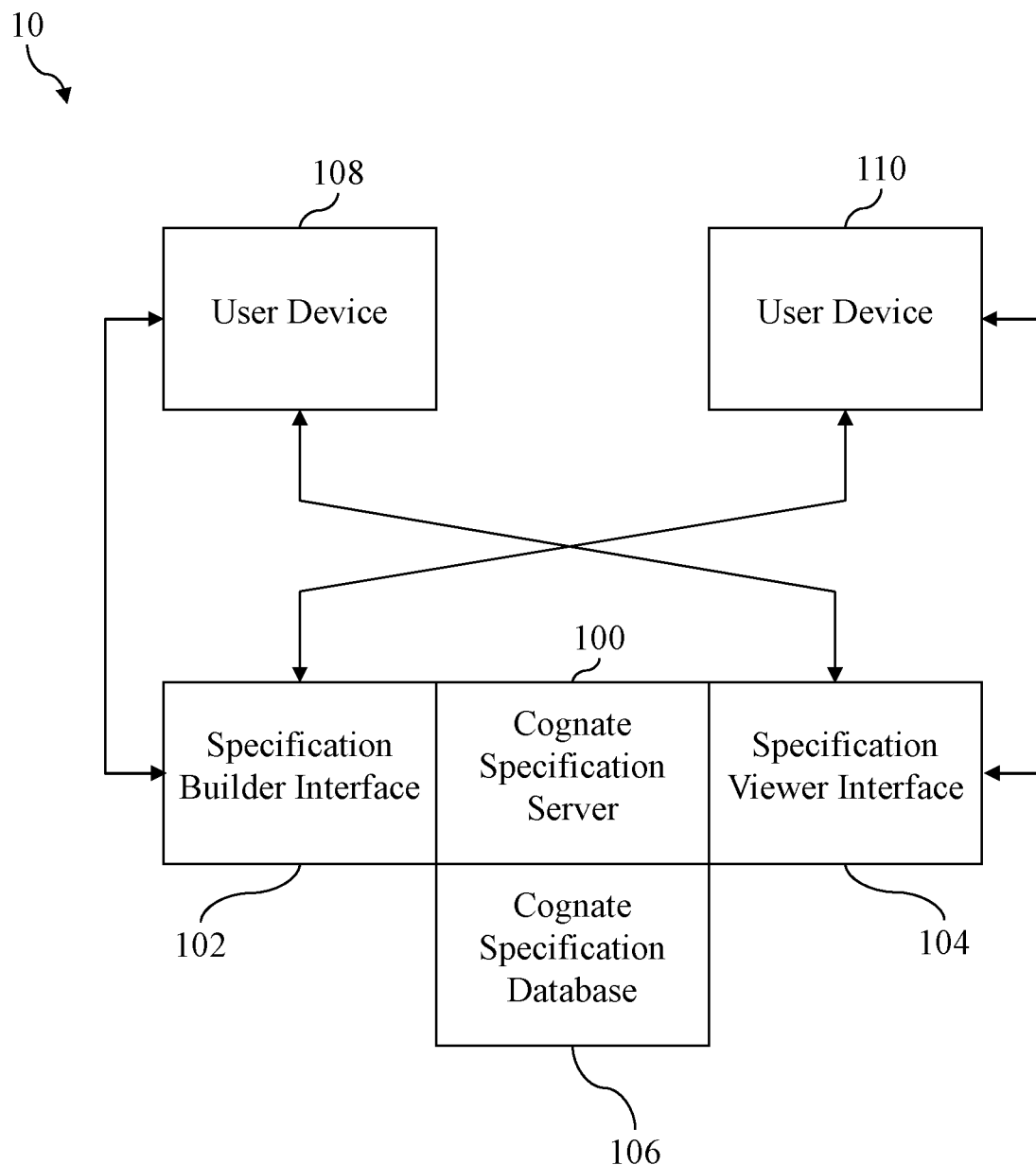
FIG. 1 is a schematic diagram of an exemplary system for managing cognate specifications.

FIG. 1 is a schematic diagram of an exemplary system (10) for managing cognate specifications. The system (10) includes a cognate specification server (100), which may be one or more servers or other devices including processors, memories, storage devices, network devices, and other features allowing the transmission, receipt, storage, manipulation, and analysis of data. The cognate specification server (100) may be one or more physical computers, virtual servers, cloud servers, or other server environments. The cognate specification server (100) is configured to allow users to interact with the system (10) via interfaces such as a specification builder interface (102) and a specification viewer interface (104). The specification builder interface (102) and the specification viewer interface (104) may include, for example, websites accessible via a web browser or other software application, mobile applications or hybrid mobile applications accessible via mobile device platforms (e.g., Android, iOS), application programming interfaces (API), software development kits (SDK), and other interfaces or communication channels. The system (10) also includes a cognate specification database (106) that is communicatively coupled with the cognate specification server (100) and may include one more local or remote (e.g., cloud storage) databases, data repositories, or other data storages.

The specification builder interface (102) is configured to allow users, via a user device (108), to access and use one or more features of the cognate specification server (100), which may include modifying and viewing data from the cognate specification database (106). The user device (108) may include, for example, a personal computer (e.g., desktop computer, laptop), a handheld device (e.g., a smartphone, tablet), a virtual computer or computing environment, a proprietary device, or other similar device having features such as a processor, memory, storage device, network device. In some implementations, the specification builder interface (102) may be a website accessible from a web browser via the user device (108), and which includes user interfaces that may be displayed to provide information from the cognate specification database (106) to a user, and that may be interacted with to receive information from the user configured to modify data stored in the cognate specification database (106).

The cognate specification database (106) may be implemented in varying ways, as will be described in more detail below. Some implementations may be implemented using RDBM principles, with software controls and schema designs configured to address one or more limitations of current designs implemented on such systems. Some implementations may use non-relational database designs (e.g., distributed databases), or combinations of relational and non-relational datasets.

The specification viewer interface (104) may be implanted in the same or a different manner as the specification builder interface (102) and may be similarly interacted with via the user device (110). The specification viewer interface (104) may allow users, via the user device (110), to view data from the cognate specification database (106) and in some implementations may include a website accessible via the user device (110). In some implementations, the specification builder interface (102) and the specification viewer interface (104) may be the same website and may be presented differently to user devices (108, 110) depending upon an account type, user registrations, or other user configuration. As an example, in some implementations the user device (108) may provide information to the cognate specification server (100) via a website in order to create a cognate specification that universally describes aspects of a physical referent such as a corrugated box. The cognate specification for a corrugated box may be stored on the cognate specification database (106) and provided to the user device (110) when requested in order to display information associated with the corrugated box.

To further the above example, the user device (108) may be associated with a first business that uses corrugated boxes to ship goods, while the user device (110) may be associated with a second business that produces corrugated boxes. In that example, the cognate specification for the corrugated box may be viewed and used by the second business to aid in the production of corrugated boxes for the first business. As will be described in more detail below, use of the cognate specification in the above example may provide one or more advantages that can improve the accuracy and efficiency with which the corrugated box may be requested and produced.

When used herein, a cognate specification may specify, for example, a physical referent such as an aggregate (e.g., a bottle of shampoo), or a component (e.g., the bottle and cap which contain the shampoo, or the label adhered to the bottle), or a material (e.g., the chemical compounds that constitute the emulsion know as shampoo, or the plastic from which the bottle and cap are constructed, or the substrate and ink from which the label is fashioned); or it may specify a digital referent such as a design (e.g., the 3D CAD drawings that specify the spatial requirements of the bottle and the cap, or the 2D canvas that specifies the graphic requirements of the label), or a process (e.g., the catalyzation process to be used in the production of plastic, or the batching process to be used in the production of shampoo, or the molding process to be used in the production of the bottle or cap, or the printing and cutting processes to be used in the production of the label, or the filling process to be used in the final production of the bottle of shampoo); or it may specify another type of referent; with each referent having one or more features contributing to their universal communicability that are enforced through the manner in which specifications are created with the specification builder interface (102), through the manner in which they are stored in the cognate specification database (106), or both.

As an example, a cognate specification for an adhesive may include cognate specifications of the materials and processes used to produce the adhesive and the ratios of the material ingredients relative to the adhesive recipe. The cognate specification for the adhesive would uniquely exist within the system (10) such that any party using the system (10) could verify the adhesive's material ingredients and could communicate with each other about the adhesive without confusion. Thus, if an adhesive producer created a new adhesive, an adhesive consumer would be able to differentiate the new adhesive from other adhesives manufactured by the adhesive producer, even where it may be advertised on a website, sales brochure, or in written or oral communication as being the same as one or more of the other adhesives.

As has been mentioned, the universal nature of the cognate specification that is described above may be enforced through one or more of configurations of the specification builder interface (102), which may include the manner in which data is requested and received from a user, configurations of the cognate specification server (100), which may include the manner in which data is processed, verified, and transmitted to the cognate specification database (106), and configurations of the cognate specification database (106), which may include the manner in which data is organized and stored when present in the cognate specification database (106). As an example, for a physical referent such as an adhesive, this may include the specification builder interface (102) being configured to receive information from a user that fully specifies the pertinent aspects of the adhesive (e.g., material ingredients and ratios, and necessary processes), the cognate specification server (100) being configured to produce a universally unique identifier for the adhesive based upon its pertinent aspects and store the universally unique identifier in the cognate specification database (106) with the pertinent aspects, and the cognate specification database (106) being configured to efficiently store and provide information related to a plurality of cognate specifications when requested by the user devices (108, 110).

Figure 2:
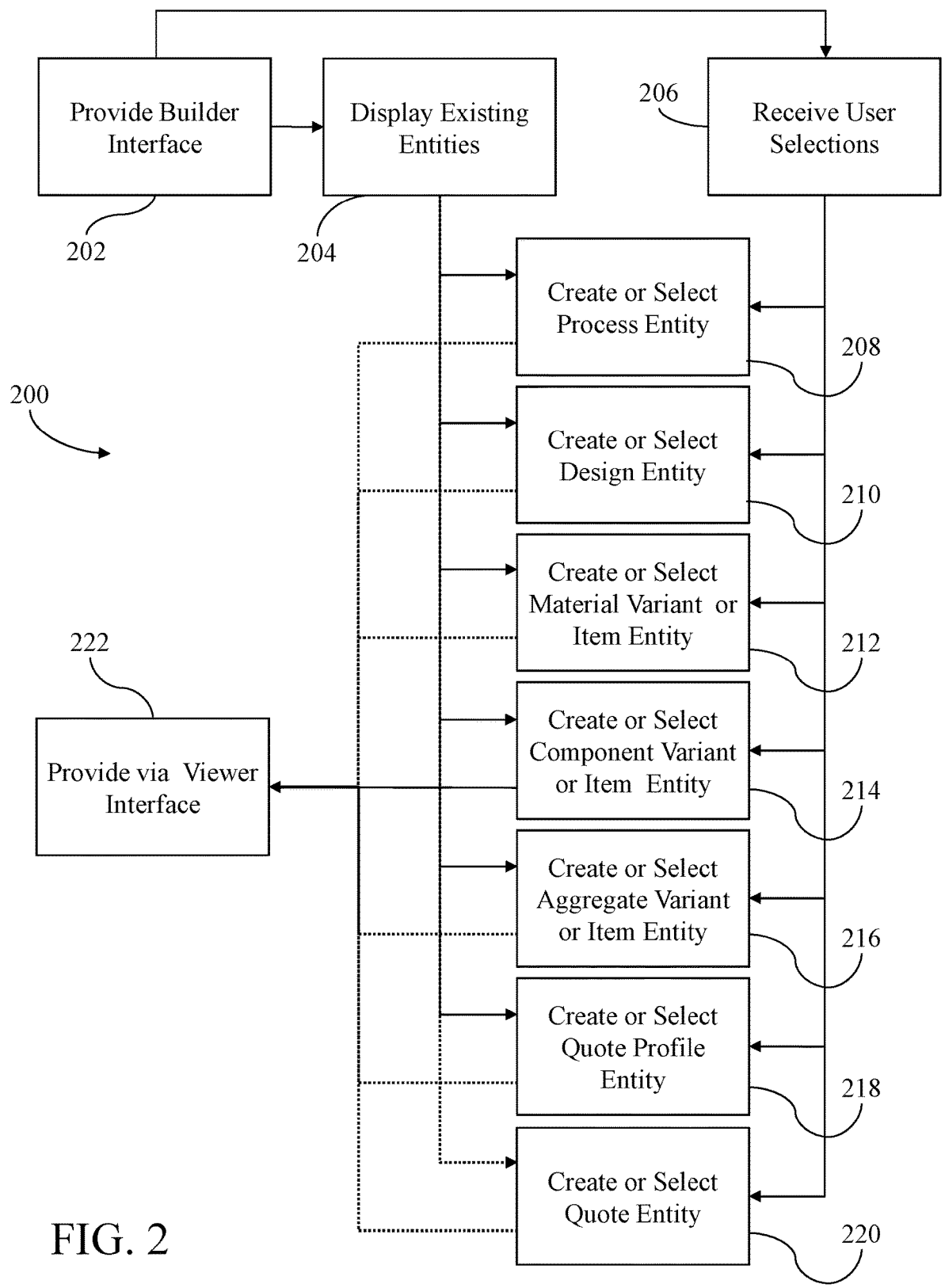
FIG. 2 is a flowchart showing an exemplary set of high-level steps that a system could perform to create and share cognate specifications.

In the context of the above high-level description of cognate specifications, FIG. 2 shows an exemplary set of high-level steps (200) that a system such as the system (10) could perform to create and share cognate specifications. The steps (200) may be performed by a user interacting with the specification builder interface (102), and may be performed as part of an exchange of data between two discrete systems (e.g., computer systems of a first business and a second business) in order to share information on a physical referent. When used in FIG. 2 and elsewhere, an "entity" may refer to a physical or digital referent and its underlying data, stored within the cognate specification database (106) or elsewhere, that are associated with a cognate specification.

Within the system (10) and as between various users of the system (10), each entity (e.g., or in some cases such as where entities are configured to be user specific, each instance of an entity) is uniquely and universally identifiable based upon an "entity identifier" (e.g., an EntityKey), which is itself based upon the specified aspects or attributes of an entity, rather than being an arbitrarily assigned unique identifier (e.g., such as a randomly seeded integer or string, or an incrementing counter). Thus, where a user unknowingly attempts to create a new entity that is already within the system (10), this may be determined by querying the available data to determine if the EntityKey of the newly specified entity is already present within the dataset. In this manner, duplicate and branching data specifying the same entity may be avoided. Based upon the above, it can also be seen that an entity associated with an EntityKey is immutable (e.g., either effectively so, or explicitly configured to be so).

An interface such as the specification builder interface (102) may be provided (202) to a user, which may include a website, mobile application, API, or other interface or communication channel as described above. One or more existing entities may be displayed (204) to the user via the interface, which may include entities that the user commonly accesses, has recently created, has recently received from other users of the system (10), or may include complete lists or repositories of all entities accessible to the user. The existing entities (204) may be stored in a database or other location as an existing entity dataset, and may be accesses or transmitted in whole or in part.

As an example, where a user has previously specified one or more entities associated with an adhesive cognate type that the user commonly views or shares on the system (10), one or more entities associated with the adhesive cognate type may be displayed (204) to the user. Each entity may specify the material ingredients, themselves entities of the chemical compound cognate type (e.g. starch, water), scalar values (e.g., 20%, 80%) representing the material ingredient ratios of the adhesive, and the process actions used to produce the adhesive (e.g. mixing, cooking). Other entities, such as a cognate specification for a corrugated substrate to be used in the manufacture of a box made for purpose of containing and protecting products during shipment, may specify the adhesive entity as a required material ingredient for that entity. Thus, relative to the corrugated substrate entity, the adhesive entity may be considered a "sub-entity" of the corrugated substrate entity while maintaining its independence as a standalone entity.

Continuing the above example, where the user wishes to share the cognate specification for that adhesive with another, or to view the cognate specification to verify the ingredients or processes related to the adhesive, or to see other cognate specifications that reference the cognate specification for the adhesive, the user may select (206) the displayed (204) entity to view further information, or to share with another user (e.g., a provider of the adhesive, an internal or external consumer of the adhesive). When communicated in this manner, risks relating to miscommunication or misunderstanding of the precise adhesive the user is dealing with are reduced or mitigated. For example, if the user commonly sells a first adhesive to another business, the user may provide the cognate specification for that adhesive to the requester to verify the request. If the seller then discontinues that adhesive and offers another adhesive to the requester that contains one more ingredient versus the discontinued adhesive (e.g. sodium hydroxide), the cognate specification for the newly offered adhesive will instead be provided to the requester, and will be immediately distinguishable from the cognate specification for the discontinued adhesive by indicating a different EntityKey and the ingredient and ingredient ratio differences between the two adhesives, even where the price, commercial or brand name, product description, and other aspects visible to the requester have not changed.

In some cases, a received (206) user selection may contain information for specifying a new entity, rather than displaying (204) an existing entity. This may occur where the user needs to create a new cognate specification for an adhesive, for example. The user may elect to create (212) the new adhesive cognate specification from scratch by selecting (206) the desired attributes from among those provided (202) to the user via the interface (222) or the user may elect to select (212) and clone an existing adhesive entity and make the necessary changes (206) to the clone in order to create (212) the new adhesive cognate specification. In either case, received selections may include information for specifying (e.g., as a party offering a new adhesive, or as a party requesting a new adhesive) aspects of the new adhesive. Cognate specification entities may be approved, immutable entities and referenceable by other cognate specification entities (e.g., the adhesive entity referenced by the corrugated substrate entity in the example above) or they be unapproved, work-in-progress entities, editable by users but not referenceable by other entities. As used above, the term "approved" may refer to an automated approval process, which may include provisionally creating entities (e.g., a provisional entity) for unapproved cognate specifications and then determining upon their approval, whether those entities already exist within the system (10), as will be described in more detail below. Received (206) user selections may then be used to determine if an entity that a user is attempting to approve is already an approved entity specified within the system.

The cognate specification database (106) and cognate specification server (100) may also be configured to organize and handle certain types of entities, as will be described in more detail below. As one example, specific entity types handled by the system (10) may include: processes which may include actions such as cutting, creasing, and printing, and the methods by which the actions may be implemented such as digital, mechanical and manual methods; composite designs that may include 2D elements such as line segments, arcs, vector graphics and pixels which may be expressed via x,y Cartesian coordinates, or 3D elements such as hypersurfaces that may be expressed via x,y,z Cartesian coordinates; materials which may include paper, plastic, metal, chemical compound, and process entity types; components which may include material, design and process entity types; aggregates which may include material, component, aggregate, and process entity types; quote profiles which may include material, component, aggregate, and process entity types; and quotes that may include quote profile entity types and corresponding transactional information such as customer, quantity and gross margin percentage. Such an example is both flexible for general application to a number of fields and may also provide particular value in manufacturing fields. Entity types may vary in some fields of application, with such variations being apparent to those skilled in the art in light of this disclosure.

Received (206) user selections may then be used to create new or select and modify existing, unapproved (208) process entities, which may include specifying process methods (e.g. cutting using a digital or computer numerically controlled reciprocating knife) or, where such approved and unapproved process entities are already present, select an existing, approved or unapproved process entity to view the details of that specification, or clone it as a starting place for the creation of another process entity.

Other received inputs may be used to create new or select (210) and modify existing, unapproved design entities, which may include two-dimensional or three-dimensional structural designs that may represent the spatial requirements of a physical referent (e.g., a set of line segments on a 2D plane showing the outline or cut lines and internal crease lines of an unfolded corrugated box, or a set of vectors in a 3D volume showing surfaces of a folded corrugated box), structural layouts (e.g., a layout of one or more of the 2D box example above) shown inside another structure (e.g., a rectangle), nested 4 up, 2 in the x direction by 2 in the y direction, graphic designs (e.g., pixels and vector graphics on a 2D plane of specific colors and positions that collectively represent text, illustrations and images to be recreated on the 2D box example above), and graphic layouts (e.g., the graphic design example above nested in the same manner as the structural layout example above), or, where such approved and unapproved design entities are already present, select an existing, approved or unapproved design entity to view the details of that specification, or clone it as a starting place in the creation of another design entity.

Figure 10:
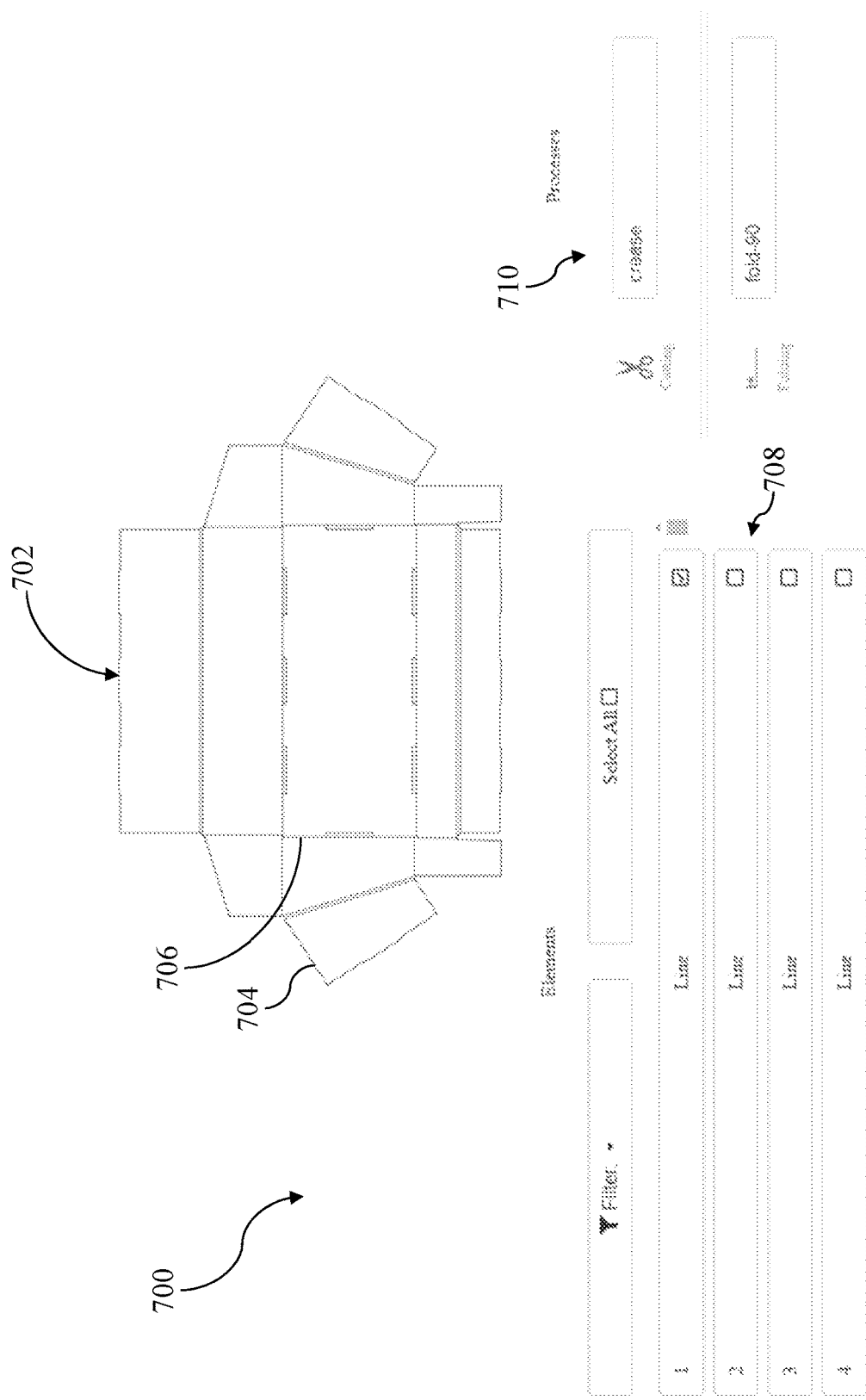
FIG. 10 is a screenshot showing an exemplary interface for defining and extending a digital referent within the cognate specification environment.

As an example, FIG. 10 shows a screenshot of an exemplary interface (700) that may be used to specify a digital referent such as the design entity examples described above. A structure (702) is displayed as a set of design elements such as line segments, arcs, circles, vector graphics, pixels and hypersurfaces within a coordinate system. Each design element may be associated with certain attributes, which may include one or more process actions associated with that design element. In the shown example, the structure (702) is a 2D structural design that represents the spatial requirements of a physical referent commonly called a tray, which may be folded into a 3D structural design that represents the spatial requirements of the same physical referent in a different state and also commonly known as a tray, while the process action or actions associated with each line segment describes manipulations required to manufacture the 2D structure and convert it into its final 3D structure. Thus, a first line segment (704) may be associated with a cutting process action. A second line segment (706) may be associated with a creasing process action and a folding process action. One or more line segments may be selected by clicking on them within the structure (702) display pane or by browsing through a design elements list (708), and one or more process actions associated with each design element may be viewed and modified by interacting with a process pane (710).

In applications unrelated to cutting, creasing and folding, design elements may be associated with process actions such as welding, sanding, applying, spraying, molding, forming or other process actions that may be associated with a design element, with such variations and additional process actions being apparent to those skilled in the art in light of this disclosure.

In some implementations the interface (700) may be used to draw or otherwise place each design element to create the structure or digital referent (702), as well as to specify process actions associated with each design element. Some implementations may support uploading of a file or dataset describing a structure (e.g., such as a *.dxf file, CNC cutting machine input file, CAD file, or other similar collection of data) in order to automatically populate some or all of the design elements of the structure (702). Some implementations may also support uploading of a file or dataset describing process actions related to the design elements in order to automatically associate each design element with corresponding process actions, which may be the same or a different file or dataset as that uploaded to populate design elements.

The interface (700) may allow the structure (702) to be viewed in various ways, including by zooming in, zooming out, and rotating in one or more directions in 2D and 3D space. The structure (702) may also be displayed with varying colors and design element appearances to indicate information related to particular design elements. For example, any line segment, arc or circle associated with a cutting process action may be displayed in red, while those associated with creasing process actions may be displayed in blue. Similarly, these line segments, arcs or circles may be displayed as different patterns (e.g., solid or dashed pattern) in order to indicate varying design element types (e.g., solid for a continuous cut or dashed for perforated cut). In some implementations, the structure (702) may be displayed, nested one or more up within another structure such as a rectangular or cube, the latter structure representing the spatial requirements of a future process, a source material, or both. In some implementations, the structure (702) may be animated to transform between two or more states based upon a user interaction, which may include displaying an animated depiction of a plurality of cutting and creasing process actions being performed on the structure (702) to produce and separate it from a source material, and a plurality folding process actions being performed on the structure (702) to produce a 3D structure, with such animations being automatically configured and performed based upon the process actions and other attributes associated with each design element.

Returning to FIG. 2, other received inputs may be used to create new or select (212) and modify existing, unapproved material entities of a particular material cognate type (e.g., adhesive), which may include material ingredients (e.g., sodium hydroxide) of a different material cognate type (e.g., chemical compounds), and scalar values (e.g., 10%) as ingredient ratios, and material process actions (e.g., mixing), or, where such approved and unapproved material entities are already present, select an existing, approved or unapproved material entity in order to view the details of that specification, or clone it as a starting place for the creation of another material entity.

Other received inputs may be used to create new or select (214) and modify existing, unapproved component entities, which may include cognate material types (e.g., single wall corrugated), component process actions (e.g., cutting, creasing and folding), and designs (e.g., 2D structural design as shown in (702)), or, where such approved and unapproved component entities are already present, select an existing, approved or unapproved component entity in order to view the details of that specification, or clone it as a starting place for the creation of another component entity.

Other received inputs may be used to create new or select (216) and modify existing, unapproved aggregate entities, which may include material entities (e.g., an adhesive entity), component entities (e.g., a component entity commonly called a container), other aggregate entities, and aggregate process actions (e.g., filling), or, where such approved and unapproved aggregate entities are already present, select an existing, approved or unapproved aggregate entity in order to view the details of that specification, or clone it as a starting place for the creation of another aggregate entity.

Other received inputs may be used to create new or select (218) and modify existing, unapproved quote profile entities, which may include cognate item types entities (e.g., a material item entity, or a component item entity, or an aggregate item entity), and process entities (e.g., a corrugating process entity, or a flexo printing entity, or a manual manipulation process entity), and design entities (e.g., one or more design layouts). Where such approved and unapproved quote profile entities are already present, inputs may be used to select an existing, approved or unapproved quote profile entity in order to view the details of that specification, or clone it as a starting place for the creation of another quote profile entity.

Other received inputs may be used to create new or select (220) and modify existing, unapproved quote entities, each of which may include a quote profile entity, and other information such as customer, quantity and gross margin percentage, or, where such approved and unapproved quote entities are already present, select an existing, approved or unapproved quote entity in order to view the details of that specification, or clone it as a starting place for the creation of another quote entity.

After creating or selecting desired entities, one or more entities may be provided (222) via an interface such as the specification viewer interface (104) to another party, which may be a purchaser, supplier, seller, internal product manager, or other party having an interest in the specified entities. Some implementations of the system (10) may treat entities as semi-private for particular users such that a user will only be displayed (204) existing entities that they have specified or that other users of the system (10) have shared with them. Such visibility may be specific to individual users, or specific to enterprise users (e.g., one or more individual users within a single company or commonly bound collection of users).

In such cases where entities are semi-private, there is a chance that two users having no shared visibility may each create the same entity. In such cases, the entity may be created, approved and stored such that it is identifiable by its EntityKey. In one case, when a second user, who is not part of the same enterprise as the first user, subsequently and independently creates and approves the same entity (e.g., an approved design entity having identical attributes, created by the first user and already existing in the dataset) a duplicate entity may be created in the cognate specification database (106) and associated with the same, existing EntityKey with which the earlier created entity is associated. In a second case, when a second user, who is part of the same enterprise as the first user, subsequently and independently creates and approves the same entity (e.g., an approved design entity having identical attributes), a duplicate entity may not be created in the cognate specification database (106) and the second user may be notified by the system (10), that the entity the second user is trying to approve, already exist in the database (e.g., already exist within the enterprise or commonly bound collection of users).

Thus the system (10), in the first case, allows each enterprise to maintain their own work-in-progress entities (e.g., a structural design as shown in (702)), which, upon approval, may become a duplicate of an existing entity where that entity's EntityKey exists in the dataset, or, where no such EntityKey exists within the dataset, that entity may become the first entity, along with its new associated EntityKey, written to the database, while in the second case, the system (10) maintains strict avoidance of duplication for the enterprise's dataset.

Furthermore, other entity types such as a base case entity types (e.g., the line segment (704) shown in (702) with its EntityID stored in (306)) may be based on immutable attributes (e.g., scalar values converted to a hash string value) which may be used to create a collection of composite hashes, which in turn may be sorted, concatenated, then hashed to create an EntityKey (e.g., a LineKey created for (704) and stored in a table (306)) that may be uniquely identified in the system (10) and referenced by other entities (e.g., shared by multiple design variant EntityIDs (308) such as the one shown in (702)) instead of duplicating the attributes (e.g., scalar values) for every entity that may include base case entity types.

Defining base case entities in this manner allows the system (10) to make more efficient use of entity storage in the database which, when scaled to support tens of thousands of entities, represents a significant improvement in efficiency. Using the 2D structural design (702) as an example, suppose ten different enterprises, each with its own approved duplicate of (702), are all using the system (10). In this case, all ten duplicates reference exactly the same collection of line segments (306), avoiding the need to store duplicate attributes (e.g., the scalar values that make up all the common design elements or line segments that constitute the duplicate variant (702)). Entity, composite identification techniques such as those described above are flexible and may be reliably utilized to maintain global entity uniqueness even in situations where duplicates are desirable, reduce global dataset size, and avoid physical and digital referent ambiguity on the part of users, as will be apparent to those skilled in the art in light of this disclosure.

In other implementations, entities may be semi-public, such that any registered user of the system (10) can browse and view existing entities. In some implementations of the system (10), users viewing entities via the specification viewer interface (104) may be unregistered users of the system (10), such that registered users can specify and share particular entities making them publicly viewable to other unregistered users. Other variations on visibility and user access exist and will be apparent to those skilled in the art in light of this disclosure.

While some implementations may include entities relating to quoting prices related to entities, it should be understood that such features are optional, and that the system (10) provides numerous advantages even where such features are not implemented. Further, the entity types described above (e.g., processes, designs, materials, components, aggregates, etc.) are exemplary, and some implementations of the system (10) may include additional entity types or fewer entity types than those shown in FIG. 2.

Figure 3A:
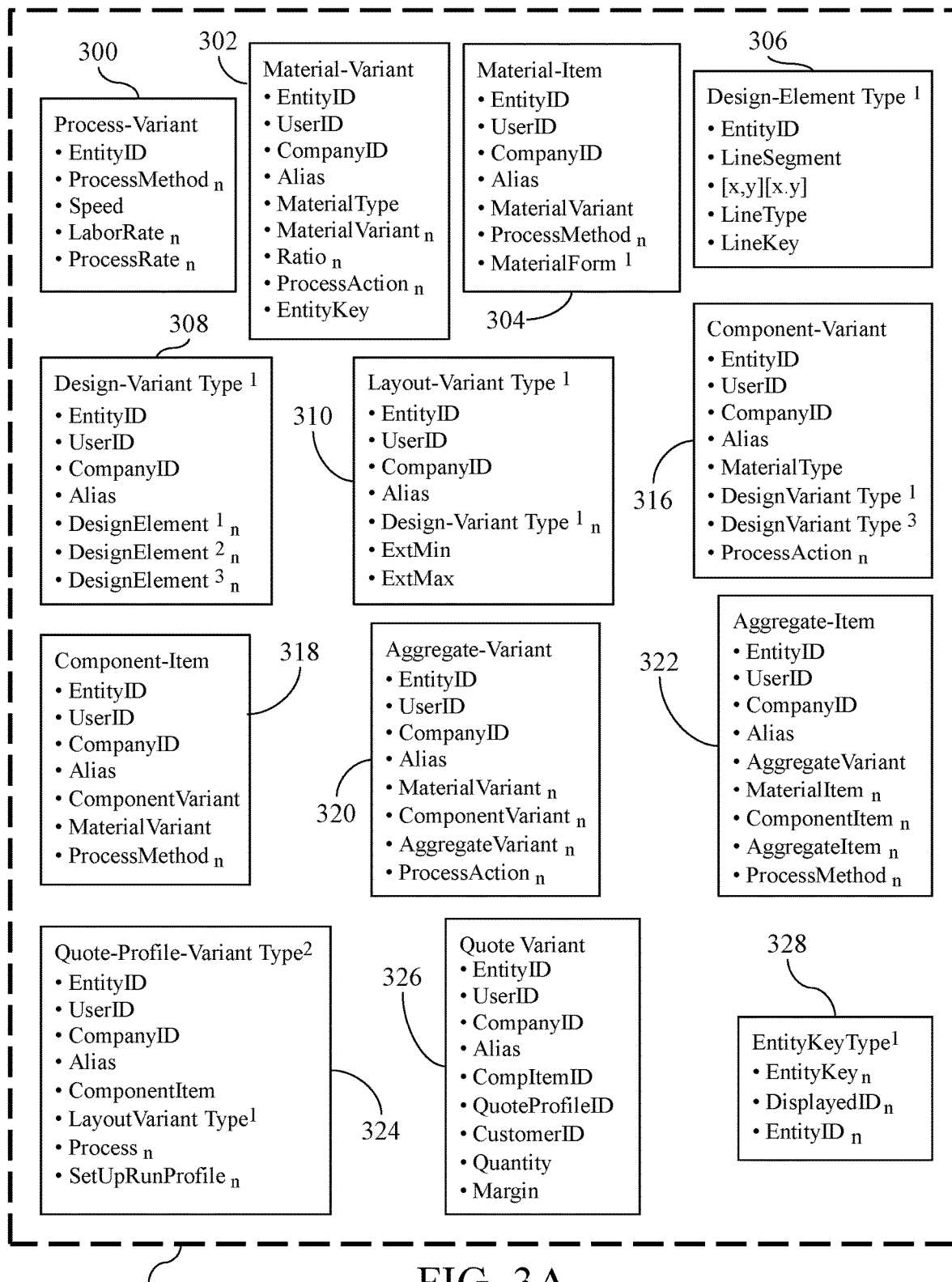
FIG. 3A is a schematic diagram showing an exemplary dataset for storing entities related to cognate specifications.

FIGS. 3A and 3B show examples of a dataset that may be implemented with the system (10), and that may be related to one or more of the steps (200). FIG. 3A is a schematic diagram showing an exemplary dataset for storing entities related to cognate specifications. The exemplary dataset may be, for example, stored in the cognate specification database (106). While the dataset is presented in FIG. 3A in a form suggestive of RDBM principles, it should be understood that it could be implemented in a non-relational or semi-relational form, and that the representation of FIG. 3A is not required and is merely to provide an example for discussion. In that figure, the cognate specification database (106) includes a variety of objects (e.g., tables, programming language objects, comma-separated data collections), each having a variety of attributes, including an "EntityID". Each represented object could be a single table (e.g., a material variant table), or multiple tables (e.g., a plurality of material variant tables with each tailored to a specific cognate material type such as an adhesive or singlewall corrugated), as will be apparent to those skilled in the art in light of this disclosure. As with the entity types described in FIG. 2, the objects shown in FIG. 3A are examples only, and some implementations of the system (10) may include additional objects and may not include each of the shown objects. For the sake of clarity, such objects will be referred to as "tables", though it should be understood that such descriptions are non-limiting and do not suggest that the objects can only be implemented as tables in a database, relational or otherwise A process variant (300) table describes processes defined (208) to specify process methods that might be performed on materials, components, and aggregates, during production or preparation. A process record might include attributes such as EntityID (e.g., a unique identifier such as a UUID or a long), one or more process methods (e.g., a process method for the process action "cutting", delivered via digitally controlled, pneumatically driven, reciprocating knife), and one or more speed and cost measurements (e.g., the speed at which the reciprocating knife transverses across the cutting surface and the hourly labor and machine rates).

A material variant (302) table describes materials defined (212) to specify materials within the system (10), which may be processed, combined, or otherwise modified to produce other materials or to be specified as source materials for component and aggregate variants. A material variant record might include attributes such as an EntityID, material type (e.g., a high-level type or category of material such as adhesive to which the material variant belongs), one or more references to other material variants (e.g., chemical compound variants such as water, starch or sodium hydroxide), and corresponding ratios (e.g., fractional [10/100] or decimal [0.10] amounts specifying the ratios of water, starch and sodium hydroxide relative to the overall adhesive recipe), and one or more process actions (e.g., mixing, cooking, drying).

A material item (304) table describes further extensions of a material variant (302). As an example, a material variant might be a particular formulation of shampoo, while a material item might be a predefined quantity of that particular formulation. A material item record might include attributes such as an EntityID, a material variant (e.g., the shampoo variant from which the shampoo item extends), one or more process methods (e.g., the process action value [mixing] (330), extended via the process method value [agitated-counter-flow] (332)), and a predefined material form dimension (e.g., [1] fluid milliliter (332)) that allows the material item to be used in a meaningful way wherever it is referenced elsewhere in the system (10) such as when a user is creating (216) an aggregate item (e.g., a bottle of shampoo designed to hold [950] fluid milliliters). As an example, with reference to FIG. 3B, a material variant record (330) is shown with exemplary data, with dotted lines illustrating a hierarchical relationship to a material item record (332). The records are linked by the EntityID (e.g., 4739210) for the material variant from which the material item EntityID (e.g., 48432001) extends, with other attributes of the material item providing additional information not of the material variant domain, but are needed to specify the material item.

As can be seen, the cognate specification database (106) of FIG. 3A provides several layers of organization for materials, and other entities, as will be described in more detail below. The most basic type may be specified as a cognate (e.g., a "cognate material"), and may specify a type of material, highlighted by its intended use, at a very high level. A cognate material might include "adhesive" generically, without any specific information about whether the adhesive is a liquid or solid, or the formulation or quantities of adhesive. Likewise, a further genericized cognate (e.g., "powder", "solution", or "suspension") may speak fundamentally to the form of the cognate material without suggesting an intended use. In either case, the cognate material might be associated with certain materials and processes specified in the manufacturing of it, without specifying the type as "adhesive" or "powder" or anything else.

The next layer may be a variant (e.g., a material variant), having attributes such as those shown in the material variant (302) table. The material variant (302) specifies a material type, which may refer back to the cognate material. As an example, a particular formulation of adhesive or suspension (e.g., water/88%+starch/10%+sodium hydroxide/2%) and the process actions it undergoes in production (e.g., mixing, cooking) may specify the adhesive or suspension variant.

The next layer may be an item (e.g., a material item), having attributes such as those shown in the material item (304) table. The material item (304) extends from and is constrained by the material variant. As an example, a particular adhesive variant entity (330), along with the process methods used to fulfill the variant's process actions (e.g., agitated counter-flow, pressurized thermal energy) as represented between the dotted line between (330) and (332), and a predefined unit of measure (e.g., 1 fluid milliliter). This value may be a reference to a value in a separate material form table (e.g., MaterialForm[1]), since this unit of measure may be applicable to all materials of the same material form (e.g., fluid), may collectively specify the adhesive or suspension item, while simultaneously extending it from the variant (330) and constraining the item's (332) formulation to that of the variant (330).

Thus, while changing the process methods employed in the material item specification may result in a different material entity (e.g., an adhesive entity with a different EntityKey (332)), the different material item will still reference the same material variant (e.g., the same adhesive formulation). As a reference aid to users using these variants and their associated items, a primary variant alias (e.g., [spencer] as the alias shown in (330)) with references from one or more secondary item aliases (e.g., [spencer-i1] as the alias shown in (332), [spencer-i2], [spencer-i3], etc.), may be auto generated and maintained by the system (10) and stored (106) alongside other entity attributes in tables such as those shown in FIG. 3A.

Additionally, the material variant (330), where specified as a material variant ingredient in a variant entity of a different cognate type (e.g., component variant entity (316)), and upon extending the different cognate type variant entity to a corresponding item entity (e.g., extending a component variant entity (316) to a component item entity (318)), may serve to constrain the list of material items (e.g., adhesive items (332)), such that all material items in the material items list are of the same formulation (e.g., an adhesive variant (330) formulation). The specification workflow (200), with its built-in identity management and constraint techniques, when compared to other systems, may reduce keyed errors and other common, misidentification mistakes made by users of those other systems.

Within the above described framework, cognate material may generally indicate an adhesive or suspension, while an adhesive or suspension variant may provide a specific formulation of adhesive or suspension made with specific ingredients and ingredient ratios via specific process actions, and an adhesive or suspension item may provide the process methods by which the process actions are implemented in the production of an adhesive or suspension variant, along with a predefined unit of measure to make it useable or specifiable in a different cognate item type such as a component item (e.g., an adhesive or suspension item entity specified in a corrugated item entity).

While the above described organization of entity data and objects (e.g., a cognate, extended by a variant, extended by an item) is not required, it may provide some advantages for some or most fields of application, in that it provides entity granularity, entity flexibility and reuse, and protection against user errors. The terms "process", "design", "component" and "aggregate" may be considered cognates in the same manner as "material" or "adhesive" or "suspension" with each having or not having interim cognates extending to its respective variant, and each respective variant extending to its respective item. In some implementations, some or all of the attributes of items may be instead associated with variants, and vice versa, either within the same cognate, or across different cognates. Further, it should be understood that other types of entity data and object hierarchies are possible, and some implementations may include organizations with additional types or fewer types, and types may depend and relate to each other in varying ways, as will be apparent to those of ordinary skill in the art in light of this disclosure.

Within that context, the cognate specification database (106) of FIG. 3A also includes design element (306), design variant (308), and layout variant (310) tables, as will be described in more detail below. Tables such as the design element (306) may represent one or more tables or objects (e.g., DesignElement$^1$ table may contain only line segment entities, DesignElement$^2$ table may contain only arc segment entities, DesignElement$^3$ table may contain only circle segment entities, DesignElement$^4$ table may contain only hypersurface entities, DesignElement$^5$ table may contain only pixel entities, DesignElement$^6$ table may contain only vector graphic entities, etc.). These design element entities may be combined to create design variants (308) which in turn may specify the physical, spatial, or graphic characteristics of component variants (316).

Design elements associated with a design type variant entity (308) record for example, may include an EntityID, one or more line segment entities, each specified by its [x,y] Cartesian coordinate end points (e.g., [0,10][10,10]), its pattern type (e.g., solid or dashed), and its process action (e.g., crease); one or more arc entities, each specified by its [x,y] Cartesian center coordinates (e.g., [0,0]), the length of its radius (e.g., [10]), its start angle in degrees (e.g., [0]), its end angle in degrees (e.g., [90]), its pattern type (e.g., solid or dashed), and its process action (e.g., cut); and one or more circle entities, each specified by its [x,y] Cartesian center coordinates (e.g., [0,0]), the length of its radius (e.g., [10]), its pattern type (e.g., solid or dashed), and its process action (e.g., cut). Collections of design elements such as those described in the design variant example above can then be mapped or specified in coordinate space to represent the structure of a box for example, which may subsequently be produced from materials and processes and used to contain and ship goods).

The position of line segments in relation to one another from the box example above may provide the spatial information that is needed to manufacture the box, while cutting and creasing process actions may provide information about the actions to be performed at each one of the corresponding line segments in a two dimensional manufacturing process. Likewise, folding process actions may provide information about the action to be performed at each one of the corresponding line segments in order to transform a 2D structural design variant (e.g., the 2D box) into its final 3D structural design variant form (e.g., the 2D box, erected and folded into its final specified shape). In the same manner as described above, 3D structural design elements (e.g., hypersurfaces) may include corresponding actions (e.g., molding) and be combined to create 3D structural design variants (e.g. collections of hypersurfaces in three dimensional space that specify a shape) which in turn may be extended to specify the physical and spatial characteristics of component variants (e.g., a physical object commonly referred to as a "bottle").

Tables such as the design variant (308) table may be one or more tables or objects (e.g., Design-Variant Type$^1$ table may contain only 2D structural design entities, Design-Variant Type$^2$ table may contain only 3D structural design entities, Design-Variant Type$^3$ table may contain only 2D graphic design entities, etc.) each containing only those design element entities that pertain to its particular design type (e.g., the Design-Variant Type$^1$ table only allows line segment, arc, and circle design elements). Tables such as the layout variant (310) table may be one or more tables or objects (e.g., Layout-Variant Type$^1$ table may contain only Design-Variant Type$^1$ entities, Layout-Variant Type$^2$ table may contain only Design-Variant Type$^2$ entities, Layout-Variant Type$^3$ table may contain only Design-Variant Type$^3$ entities, etc.). For example, a Layout-Variant Type$^1$ (310) table may include attributes specifying the manner in which one or more Design-Variant Type$^1$ entities will be oriented in space during the manufacturing process. As an example, a Layout-Variant Type$^1$ entity may specify one of more Design-Variant Type$^1$ entities within a particular space (e.g., a rectangle large enough to accommodate one or more of a 2D structural design such as the one shown in (702)), with the position of each design variant entity specified by its minimum and maximum [x,y] coordinate extensions (e.g., ExtMin=[1,1] and ExtMax=[21,11]) or bounding rectangle.

A component variant (316) may extend from the cognate "component" and may include attributes such as an EntityID, a cognate material or type (e.g., singlewall corrugated), one or more design variant entities (e.g., one Design-Variant Type$^1$ entity and one Design-Variant Type$^3$ entity), and one or more process action entities. Continuing with the box example above, a component variant may be built by specifying a cognate material (e.g., single wall corrugated), a design variant (e.g., a Design-Variant Type$^1$ entity that specifies the box's 2D structure as described in the previous example), plus another design variant (e.g., a Design-Variant Type$^2$ entity that specifies the box's 3D structure), plus another design variant (e.g., a Design-Variant Type$^3$ entity that specifies vector graphic or design elements (306), solidly filled with hex color #000000 or black, confined and desirably oriented within a space equal to the perimeter of the Design-Variant Type$^1$ entity, such that the design elements collectively form text of a particular font, size and position that reads "ACME Box Company" to the viewer of the box), along with all the specified process actions (e.g., printing, cutting and creasing, and folding) necessary to extend the above design variants to the desired component variant.

A component item (318) may include attributes such as an EntityID, a component variant entity, a material variant entity, and one or more process method entities. It may be associated with a component variant (316), similar to the manner in which material variant (302) and material item (304) are associated. Continuing with the component variant box example above, the variant's cognate material type (e.g., single wall corrugated) may be extended by specifying any one of the material variant entities of that material type (e.g., a single wall corrugated variant entity with a specific combination of paperboard and adhesive variant entities along with a specific flute height). Likewise, the Design-Variant Type$^1$ and Design-Variant Type$^3$ entity process actions specified in the component variant may be extended by specifying a particular process method for each process action (e.g., a flexo printing process method to extend the component variant printing process action, a flat rule process method to extend both the component variant cutting and creasing process actions, and auto-mechanical process method to extend the component variant folding process action).

An aggregate variant (320) and an aggregate item (322) may have a similar association (e.g., an aggregate variant extends an aggregate item), and aggregate item attributes may specify information not of the aggregate variant domain, that may be necessary to manufacture the physical object or referent of the aggregate item. An aggregate variant (320) may extend from the cognate "aggregate" and may include attributes such as an EntityID, zero or more material variant entities as input, zero or more component variant entities as input, zero or more aggregate variant entities as input, and one or more process action entities needed to specify the aggregate. Aggregate item attributes may include an EntityID, an aggregate variant entity, zero or more material item entities as input, zero or more component item entities as input, zero or more aggregate item entities as input, and one or more process method entities performed to produce an aggregate item.

Tables such as quote profile variant (324) table may be one table such as the component item quote profile example described in more detail below or multiple tables (e.g., one for component item quote profile, one for material item quote profile, and one for aggregate item quote profile). While not required in implementations supporting automatic calculation of pricing, a quote profile variant (324) table may specify process entities, manufacturing set up and run profile entities, along with calculated material and process costs, which may be used to produce a component item quote (326). Quote profile attributes may include an EntityID, a CompItemID (e.g., a reference to an EntityID of a component item (318), one or more process variants (300), and one or more manufacturing set up and run profiles. Associated material and process costs may be statically defined numeric values or equations that receive dynamic inputs (e.g. material and process basis costs) from source tables such as process variant (300) or other sources such as material item purchase history which, along with integer or decimal values such as quantity and gross margin % entered by the user during the quotation process (326), may be used to calculate a total component item unit cost, composite or individual process and material costs of the component item, or all of the above.

A quote variant (326) may extend a quote profile variant, and may include attributes such as an EntityID, a CompItemID such as described in the quote profile example above which may be used to constrain, a QuoteProfileID (e.g., a reference to a quote profile variant's EntityID) selectable from a list of quote profiles limited to only those QuoteProfileIDs associated with the CompItemID, a CustomerID (e.g., a reference to a customer's EntityID), an integer (e.g., [200]) that represents the quoted quantity and a decimal or percentage greater than 0.00 but less than 1.00 (e.g., [0.50]) that represents the gross margin % for the component item (318) being quoted, perhaps the CompItemID whose referent is a physical object such as a corrugated box which may be uniquely identified by its EntityKey. Information associated with a quote profile variant (324) and a quote variant (326) may be used to automatically calculate a price to be charged in order to achieve the desired profit margin, for producing and selling or buying the quantity of physical referents commonly known as raw materials, objects, products, or goods.

Cost information may be determined for a particular material, component or aggregate by tracing through a data structure such as that shown in FIG. 3A. As an example, each table may include associated entities of, or may be usable to determine a cost associated with, input entities. In such an example, a particular aggregate item may be associated with any number of components items and their corresponding processes, layout variants, and quote profiles, and these component items themselves may be associated with any number of material items and their corresponding processes and quote profiles. Thus, each of the input entities may be traced backwards allowing their respective basis costs to be fetched from the source tables or other sources such a purchase history and used in an equation to calculate a per-entity cost for that aggregate item. Such information may then be used to determine, for a particular quantity of that aggregate item, a sales price to achieve an estimated gross profit margin % and contribution (e.g., estimated dollar difference between the revenue potential of the quote and the potential, total cost of goods of the quote).

Some implementations of the cognate specification database (106) may include a master EntityKey Type[1] (328) table, which may serve as a central repository for EntityKeys defined within the system (10). Master EntityKey Type[1] attributes may include an EntityKey for an entity that is specified and approved within the system (e.g., a composite hash key derived from one or more "sub-entity" composite hash keys to which an EntityID for a material variant (302) refers), one or more EntityIDs such as the EntityID for the material variant example above, and a DisplayedID (e.g., a shortened version of the EntityKey or system (10) wide unique integer paired with the EntityKey that may be more viewer friendly than the EntityKey hash string). In another implementation, only the EntityKey and the DisplayedID may be stored in the table (328) with a reference to the corresponding EntityKey and DisplayedID being stored in entity tables containing the approved, corresponding EntityIDs (e.g., the table (302) containing the EntityID of an approved material variant containing a reference to a particular EntityKey and DisplayedID pair stored in another table (328)).

In such an implementation, the table (302) may include an alias which may be an additional identifier associated with the EntityID (e.g., an arbitrarily assigned, human readable string such as a person's name or another proper noun, or an arbitrary phrase that may be used to refer to a particular entity in oral or written communication for example, as opposed to reading out an EntityKey or DisplayedID) which may also be implemented as metadata. These aliases may be implemented on an enterprise or collection of users basis such that the aliases may be controlled and not duplicated within the enterprise (e.g., only one [spencer] which represents material variant EntityID 4739210 and therefore no other EntityID within [acme]). Implementations that include references to EntityKeys in separate tables and the use of aliases to aid user communication may be employed across one or more (e.g., (300) through (326)) cognate specification types as will be apparent to one skilled in the art in light of this disclosure.

Figure 4:
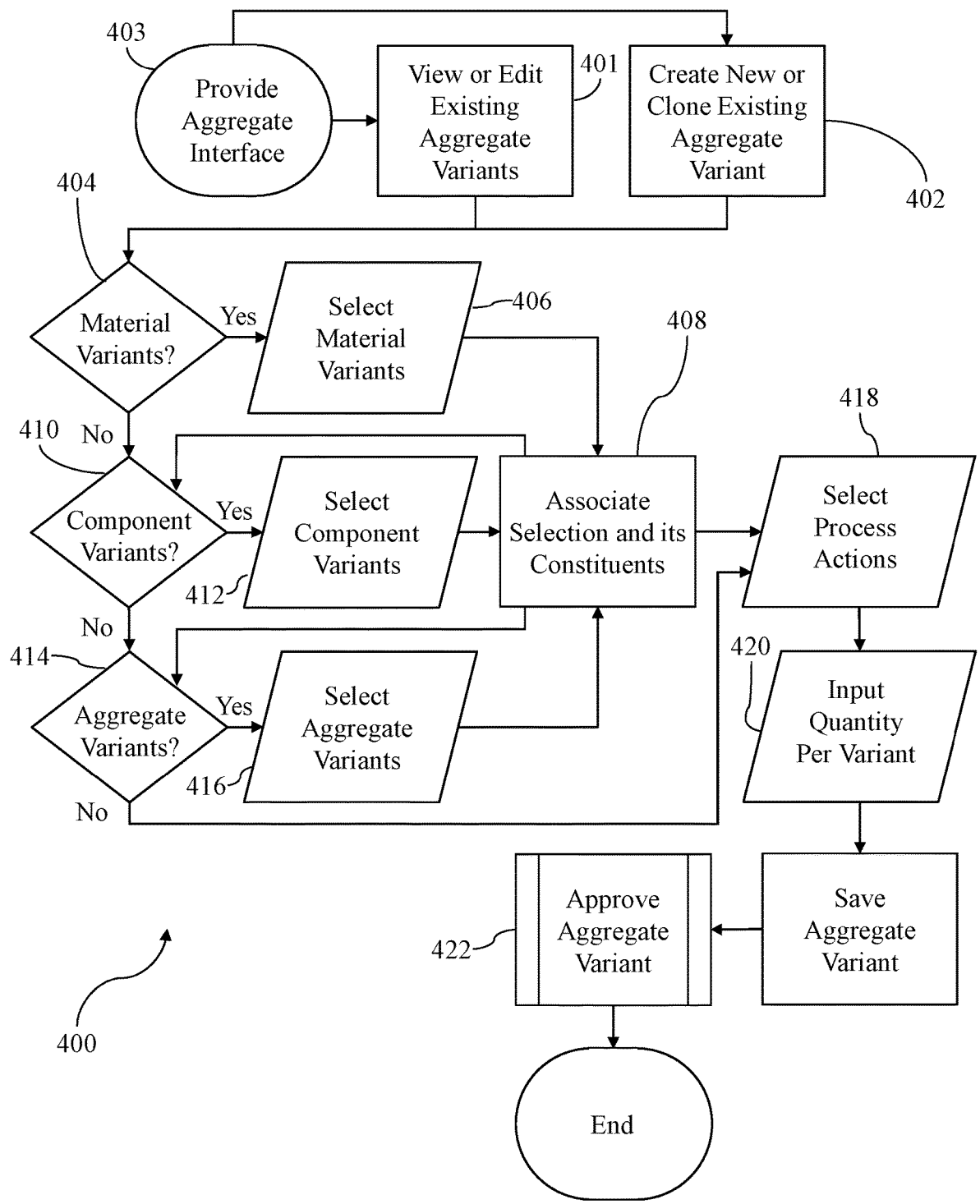
FIG. 4 is an exemplary use case showing the relation between entities within a cognate specification environment.

While a number of examples of the relationship between entities and use cases for the system (10) have been provided, FIG. 4 shows a use case that illustrates a more detailed exemplary relationship between entities within a cognate specification environment. Among other things, FIG. 4 illustrates both the relationship between some entities, as well as a potential use case (400) for a user interacting with the system (10) as shown in FIG. 2 to define the recursive, hierarchical and granular nature of the entities that make up the aggregate variant (320), the predecessor to an aggregate item (322) or transaction ready, producible object, with such entities being structured to reflect some aspects of the data model of FIG. 3A. The use case (400) describes steps to specify a boxed set of merchandise (e.g., a 12 count case of shampoo), but the concept may be applied to other objects and fields of use, as will be apparent to one skilled in the art in light of this disclosure. Further, the use case (400) will describe user inputs or selections generally, and it should be understood that within the context of FIG. 3A such selections may be at varying levels of abstraction (e.g., selections may be of cognate level entities, variant level entities, item level entities, or another level of detail).

After a user interacts with the system (10) in order to view or edit (401) existing aggregate variants, the system (10) may provide (403) an aggregate interface. A user may create (402) a new or clone an existing aggregate variant which once completed and approved (422), may identify its physical referent (e.g., a 12 count case of shampoo) by means of a unique identifier (e.g., an EntityKey such as that from the EntityKey Type[1] table (328)) which may be created programmatically from the composite entities making up the aggregate variant.

A user may provide information indicating (404) whether the new aggregate variant should include one or more material variants (e.g., an approved material variant of cognate type "shampoo" identified by its EntityID and associated EntityKey (328) and contained in a table such as material variant (302)). Received information may indicate selection of one or more material variants (406) such as the example described above, at which point those material variants' identities (e.g., their corresponding EntityIDs (302) and EntityKeys (328)), and by extension any of the latter's composite material variants' identities (e.g., their EntityIDs (302) and corresponding EntityKeys (328)) which, for example, may be material variants of "chemical compound" cognate type, their corresponding ratios (302) (e.g., [0.10]) and their corresponding process actions (302) (e.g., mixing), may all become associated with the newly created and approved aggregate variant (408) with its associated EntityKey (328) being a hash of other composite hashes. Thus from an aggregate variant such as the one detailed above, a user may transverse back and forth across all associated cognate specification entities composite to the 12ct case of shampoo, beginning at the aggregate level and ending at some base case entity (e.g., any of the "chemical compounds" (302) specified in the shampoo (302) itself or any of the "line segments" (306) specified by the shipping container's (316) associated 2D structural design (308)).

A user may provide input indicating (410) whether the new aggregate variant should include one or more component variants (e.g., an approved component variant identified by its EntityID and contained in a table such as component variant (316) and associated with a composite EntityKey (328)). Received information may indicate selection (412) of one or more component variants (e.g., referents of physical objects commonly known as "caps", "bottles", "labels" and "shipping containers"). Each of these example physical referents may be identified by a unique identifier such as an EntityID (316) and its associated EntityKey (328) which may be a composite key programmatically created from its component variant (316) constituents which may include the associated EntityKeys of a material type such as plastic (e.g., MaterialType (316)), a structural design (e.g., a DesignVariant Type[2] (316) that may reference a 3D design variant (308)), and with each selection (412), these component variants, and by extension their constituent variants such as those described above, become associated with the new aggregate variant (408).

A user may provide input indicating (414) whether the new aggregate variant should include one or more aggregate variants (e.g., an aggregate variant of cognate type "aggregate" identified by its EntityID (320) and its associated EntityKey (328)). Received information may indicate the selection (416) of one or more aggregate variants (e.g., the referent of a physical object commonly known as a "bottle of shampoo"), identified by a unique identifier such as an EntityID (320), and its associated EntityKey which may be a composite key programmatically created from the associated EntityKeys of the selected (416) aggregate variant's material variant constituents (406), or a composite key programmatically created from the associated EntityKeys of the selected (416) aggregate variant's component variant constituents (412), or a composite key programmatically created from the associated EntityKeys of the selected (416) aggregate variant's aggregate variant constituents (416), or a composite key programmatically created from the associated EntityKeys of any combination of the above selected (416) aggregate variant's three variant constituents, (406) (412) (416), at which point (416) those aggregate variants, and by extension their variant constituents such as those described above, become associated with the new aggregate variant (408).

User selections may also be received indicating additional process actions (418) such as those the new aggregate variant may require. These may be predefined process actions (e.g., stack, fill, collate, insert, combine, etc.) that the user may select or they may be dynamic inputs from sources such as a table similar to design variant (308), created for the purpose of specifying multiple design variants (308) within a specific collection of design variants, and the corresponding process actions that may be required to assemble the collection into a digital representation of an aggregate variant (422). User selections may also be received (420) indicating quantities for each of the variants selected, (406), (412) and (416), to be associated with the new aggregate (408).

In a first example of the 12 count case of shampoo, a user may be building (408) the new aggregate variant specification (422) to reflect the expectation that the entire process may take place on an automated production line and thus may include material (406) and component (412) variants, but not aggregate (416) variants. The user may know that the component variant (e.g., a bottle), or more specifically the 3D design variant it references, was designed specifically to contain as much as [950] milliliters of some fluid material. As such they may specify that the material variant (e.g., "shampoo" or "emulsion") and the bottle be associated with a process action (418) (e.g., filling) and specify that the bottle be filled (420) with an amount (e.g., [950] ml) of material variant, in order to produce a bottle/shampoo assembly or interim aggregate variant.

They may further know the "cap" component variant is referenced to a 3D design variant specifically designed to accept a male thread configuration such as that specified by the bottle 3D design variant. As such, they may specify that the bottle/shampoo assembly and cap be associated with a process action (418) (e.g., fastening) in order to produce a bottle/shampoo/cap assembly or interim aggregate variant.

They may further know that the bottle/shampoo/cap assembly needs to include consumer information such as that included on the "front label" component variant or more specifically the DesignVariant Type[3] (308) it references, and that included on the "back label" component variant or more specifically the Design Variant Type[3] (308) it references. As such they may specify that the bottle/shampoo/cap and the front label be associated with a process action (418) (e.g., labeling). They may also specify that the bottle/shampoo/cap/font-label assembly and the back label be associated with a process action (418) (e.g., labeling) in order to produce a bottle/shampoo/cap/front-label/back-label assembly or interim aggregate variant.

They may further know that the "shipping container" component variant, or more specifically the 2D and 3D design variants it references, was designed and sized to a specific cube and that it will accommodate 12 of the bottle/shampoo/cap/front-label/back-label assemblies positioned in a particular 2×6 pattern, so they may specify (420) that [12] bottle/shampoo/cap/front-label/back-label assemblies or interim aggregate variants and [1] shipping container be associated with a process action (418) (e.g., insert).

In a second example, the bottle/shampoo/cap assembly may be built (408) as a first aggregate (e.g., an aggregate (422) that contains all requisite variants (416) and process actions (418) included in the bottle/shampoo/cap assembly as described above with a quantity (420) of [1]) and used in a second aggregate (e.g., an aggregate that contains the first aggregate plus all requisite variants and process actions included in the first-aggregate/front-label/back-label assembly (422) with a quantity (420) of [12] and shipping container (412) with a quantity (420) of [1]), to produce the same aggregate variant exemplified in the first example, with both examples (422) hashing to the same EntityKey (328).

In a third example, the aggregate from the first example may be broken down into a different combination of aggregate variants and process actions from those described in the second example, and recombined to produce the same aggregate variant exemplified in the first and second examples, each different combination (422) hashing to the same EntityKey (328).

Figure 5:
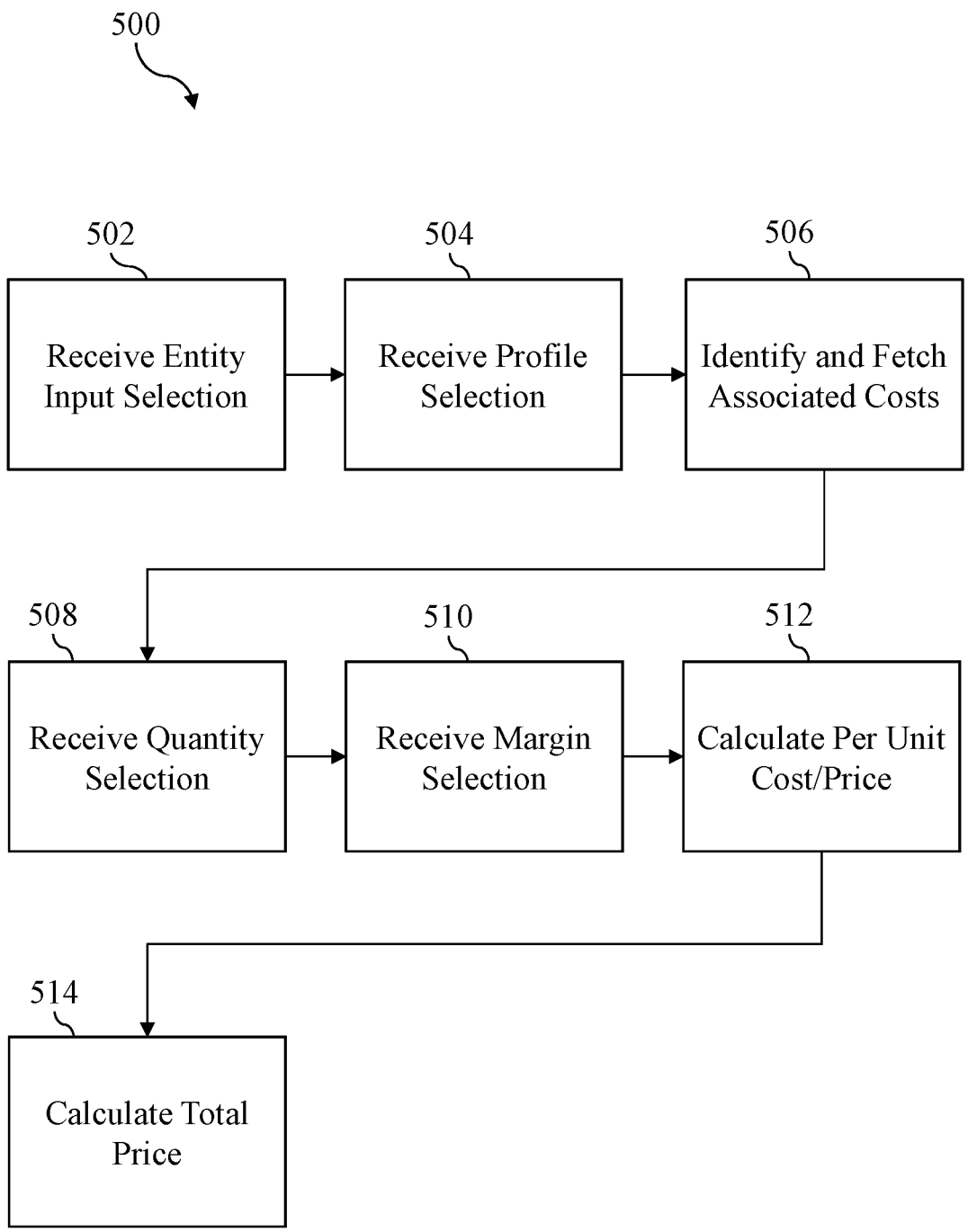
FIG. 5 is a flowchart showing an exemplary set of steps that a system could perform to automatically create pricing information based upon entities specified within the cognate specification environment.

FIG. 5 is a flowchart showing an exemplary set of steps (500) that a system could perform to automatically create pricing information based upon physical and digital referents defined within the cognate specification environment. This may be useful where, for example, a plurality of material and process entities are associated and stored with cost or labor information associated with providing that material or performing that process. Such costs may be non-linear, such as where a particular material has a scaling cost dependent upon the amount of material needed, or where a particular process has a scaling cost dependent upon the duration or numerosity of the process being performed (e.g., a set up cost associated with a particular printing job, such that the cost is the same regardless of the substrate quantity to be printed, whether 200 or 2,000 single wall corrugated sheets, for example). In such a case, any material, aggregate, component, or other producible entity may have an associated cost calculated by recursively traversing and retrieving required basis costs from the hierarchy of sub-referents and sub-processes that may be included in the production of the producible entity.

In order to produce a cost estimate, quote, or other cost or labor figure associated with a producible entity, an entity input selection may be received (502) (e.g., such as a material item (304), a component item (318), or an aggregate item (322)) and a profile selection may be received (504) (e.g. such as a quote profile (324)) in order to identify and fetch (506) associated basis and static costs by tracing back through one or more input sub-referents and its processes. An entity input selection received (502, 504) from a user may determine which sub-referents or associated entities are included in the calculation.

As an example, the first shampoo variant example as described above, in order to transform it into a producible, quotable item, may be extended to an associated shampoo item (322). Thus upon extending the shampoo variant (422) to the shampoo item (322), the system (10), based on the (408), (418) and (420) constraints extended from the shampoo variant, may automatically determine that the shampoo item needs to include a particular quantity (420) of some bottle component item (318), a particular amount (420) of some shampoo material item (304), a particular quantity (420) of some cap component item (318), a particular quantity (420) of some front label component item (318), a particular quantity (420) of some back label component item (318), a particular quantity (420) of some shipping container component item (318), and a particular collection (418) of some process methods (300), or in other words, all entity types and related attributes required by the aggregate variant, a 12 count case of shampoo.

By comparison, the second example variant's extended, associated shampoo item (322) may automatically include a particular quantity (420) of some bottle component item (318), a particular amount (420) of some shampoo material item (304), a particular quantity (420) of some cap component item (318), and a particular collection (418) of some process methods (300), or in other words, all entity types and related attributes required by the aggregate variant, a single bottle of shampoo. Thus, as the above examples illustrate, a quote profile (324) extended from or associated with the first shampoo item would calculate a per unit (322) cost (512) based on all sub-referents or entities needed to produce the entire [12] (420) count case of shampoo (322), whereas a quote profile extended from or associated with the shampoo item would only calculate a per unit cost (512) for all sub-referents or entities needed to produce a single or [1] (420) bottle of the same shampoo (322). The calculated (506) costs may include static inputs or variable inputs (e.g., a printing process variant (300) which may include a ProcessRate (300), one or more LaborRates such as the labor rates to set up and operate the process variant, and the Speed (300) at which the operator may expect to run the process variant during the production of a component item (318)) associated with a particular quote profile variant (324).

A quantity selection may be received (508) indicating a number of the physical referent items for which the cost should be calculated (e.g., one hundred of a producible entity as described in one of the shampoo item examples above). A margin selection may be received (510) indicating a margin of profit or other profit goal and a sell price that a producer or requester of the producible physical referent item desires in relation to producing and transacting producible entities.

Figure 6:
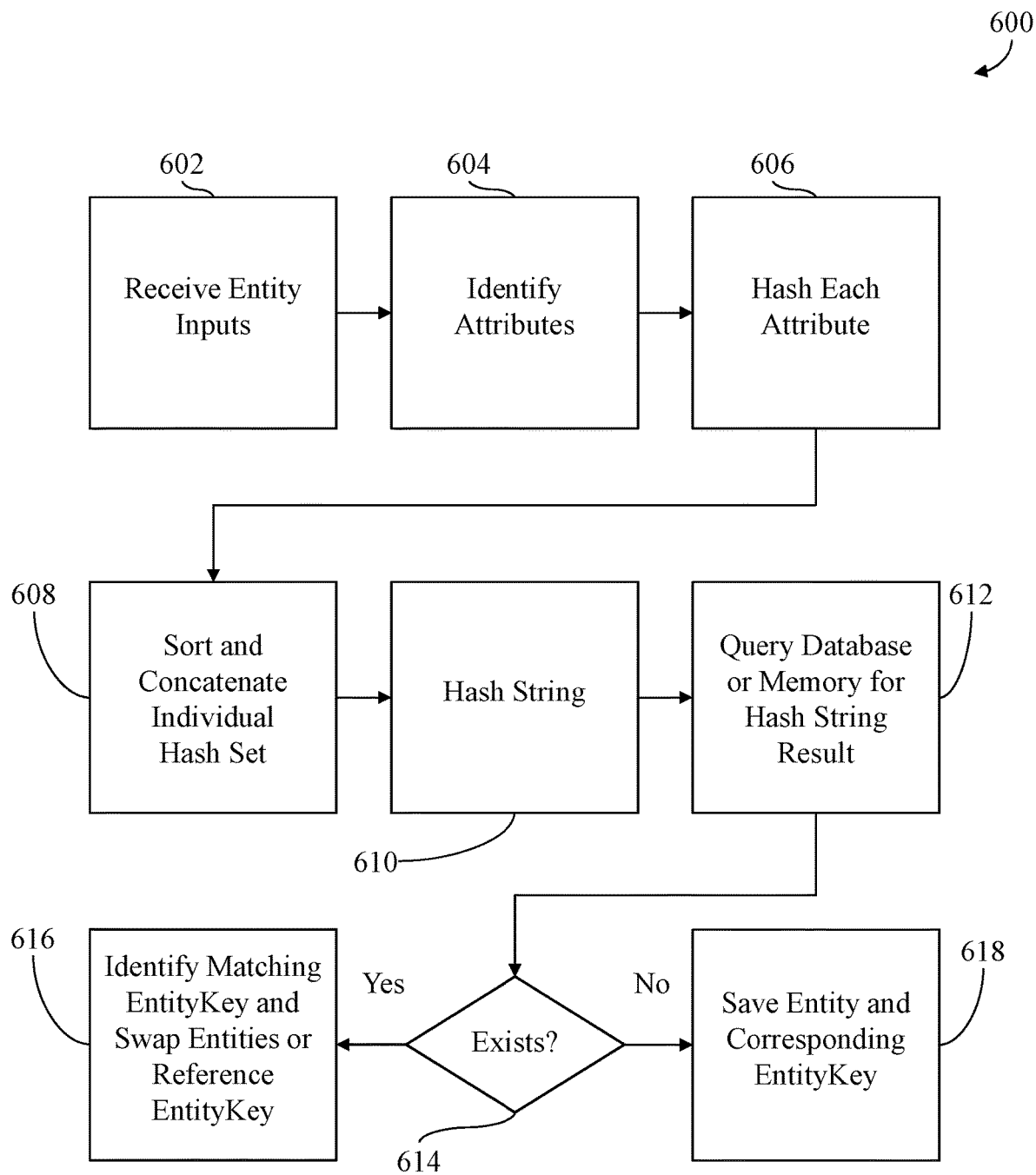
FIG. 6 is a flowchart showing an exemplary set of steps that a system could perform to create canonical representations of entities within the cognate specification environment.

Some of the above figures and descriptions have referred to the advantageous aspects of organizing and storing entities using an EntityKey that uniquely identifies each entity, based upon the attributes of the entity. FIG. 6 provides one example of a set of steps (600) that may be performed to produce an EntityKey for entities. A number of user inputs or selections may be received (602) that defines an entity (300-326) that a user is attempting to specify, add or approve within the system (10).

Received inputs may vary based upon a particular structure of the cognate specification database (106) and types of entities supported, with FIG. 3A showing examples. In one example, a user may be specifying an aggregate variant (e.g., to be added to the aggregate variant (320) table), where received (602) inputs may include specifying zero or more material variants as input, zero or more component variants as input, zero or more aggregate variants as input, and one or more predefined process actions to be performed on the aggregate variant. In another example, a user may be specifying a component variant (e.g., to be added to the component variant (316) table), where received (602) inputs may include specifying a material type (e.g., a cognate material or broad category of material such as singlewall corrugated or adhesive), a design variant (e.g., a structural design variant (308), and a graphic design variant (308)), and one or more predefined process actions to be performed on the component variant.

In another example, a user may be specifying a material variant (e.g., to be added to the material variant (302) table), where received (602) inputs may include specifying a predefined material type (e.g., a cognate material or broad category of material such as singlewall corrugated, adhesive, plastic, metal, etc.), one or more material variants and the corresponding ratio (e.g., [0.10] as an ingredient-to-recipe ratio for "dry" or "fluid" bulk, homogeneous material variants like adhesive, or [1] as a ratio for "solid" countable, heterogeneous material variants like singlewall corrugated) for each of the material variants, and one or more predefined process actions to be performed on the material variant.

As described, a composite entity may include as an attribute (604), an EntityKey (328) comprised of and programmatically created from, one or more EntityKey (328) inputs (e.g., a component variant entity (316) having an EntityKey (328) that includes an associated material type EntityKey which may be a hash of a string such as "singlewall-corruagated", one or more associated design variant (308) EntityKeys (328), each of which may be comprised of one or more DesignElement (306) EntityKeys such as LineKeys, ArcKeys, CircleKeys, HypersurfaceKeys, PixelKeys, VectorGraphicKeys, or other values, and one or more associated predefined process action EntityKeys (328), each of which may be a hash of a string such as "cutting", "creasing", "printing", etc.). Some base case entities which may be predefined in the system (10) and made available to users for selection, such as those of a cognate material type (e.g., "chemical compound"), may not include multiple constituent EntityKey entities, and so its EntityKey may only include and be constructed from a string that represents a name (e.g., "sodium hydroxide"). Other shared, non-duplicated or entities such as the LineKey example referenced above, may be composite, immutable entities where each such entity's EntityKey may include and be constructed from attributes consisting of scalar values, scalar-value pairs, strings, or other values, or some combination of thereof (e.g., LineKey (306) constructed from a numeric, scalar-value pair such as [0,0][10,10] (306), and a LineType (306) string value such as "cut", "crease", "solid", "½×½", etc. (306)).

As another example, an entity EntityKey may include some combination of string and numeric values as scalar, attribute-sets (604) (e.g., "sodium hydroxide"—[0.02] (330)). These attribute-sets may be entities or non-entities such as code, and may specify a characteristic of an entity in which the attribute-set may be included (e.g., as an ingredient in various recipes of adhesive or suspension variants). Other attributes (604) may consist of an EntityKey or hash plus a string value or numeric value, or various combinations thereof (e.g., an EntityKey for a shampoo variant (302) used as a MaterialVariant (304) in a shampoo item (304), plus (304) all that item's ProcessMethod (300) EntityKeys (328), plus a predefined unit of measure [1] or numeric value referenced by MaterialForm (304), combined in some ordered fashion and then hashed to create an EntityKey (328) for the shampoo item (304)).

In another implementation, all scalar values may be hashed first, then sorted, concatenated and hashed to create contextual hashes that may be used in the creation of other composite entity type EntityKeys (328). In such an implementation, the scalar or string "1,2,3-Propanetriol", commonly called glycerin, the scalar vector [0.20], may each be hashed individually, with their resulting hash strings then sorted and concatenated, perhaps with a separator such as a dash "-" or comma "," in between the concatenated input strings, then hashed as a first composite EntityKey to be referenced in any formulation or recipe that calls for or specifies it be 20% glycerin. Each of the identified (604) attributes, whether they be hash strings or EntityKeys, scalar values, or some combination thereof, may then be ordered (608) (e.g., by sorting alphanumerically, reverse-alphanumerically, or by some other ordering principle) and subsequently concatenated into a string which may be hashed using one of various hashing functions (e.g., MD2, MD4, MD5, SHA1, SHA256 or others) to produce a hash string or EntityKey value for an entity. A change in any scalar value or EntityKey input will thus produce a different EntityKey. Therefore, to produce reliable EntityKeys, one may need to consider not only the scalar and EntityKey value inputs, but also the sequence in which these inputs are hashed, as those skilled in the art will understand in light of this disclosure.

Varying implementations of the system will create and utilize composite identifiers, as described above, in varying ways. For example, composite identifiers may be hash vales of input strings, but may also be encoded in other ways as will be apparent to those of ordinary skill in the art in light of this disclosure. Composite identifiers may be stored in a database or existing entity dataset as existing composite identifiers, or may be newly created and associated with provisional entities during creation of those entities. Composite identifiers may be associated with a variety of other tables and data within the dataset and, for example, may be associated with an existing entity, a provisional entity, a user specific entity, or other entity types at varying stages of the process. In some implementations a composite identifier may be created from an entity identifier string, which may itself be created from an aggregate of subcomponents (e.g., such as a number of sub-entities or sub-composite identifiers sorted and concatenated together in a universally common way).

Figure 9A:
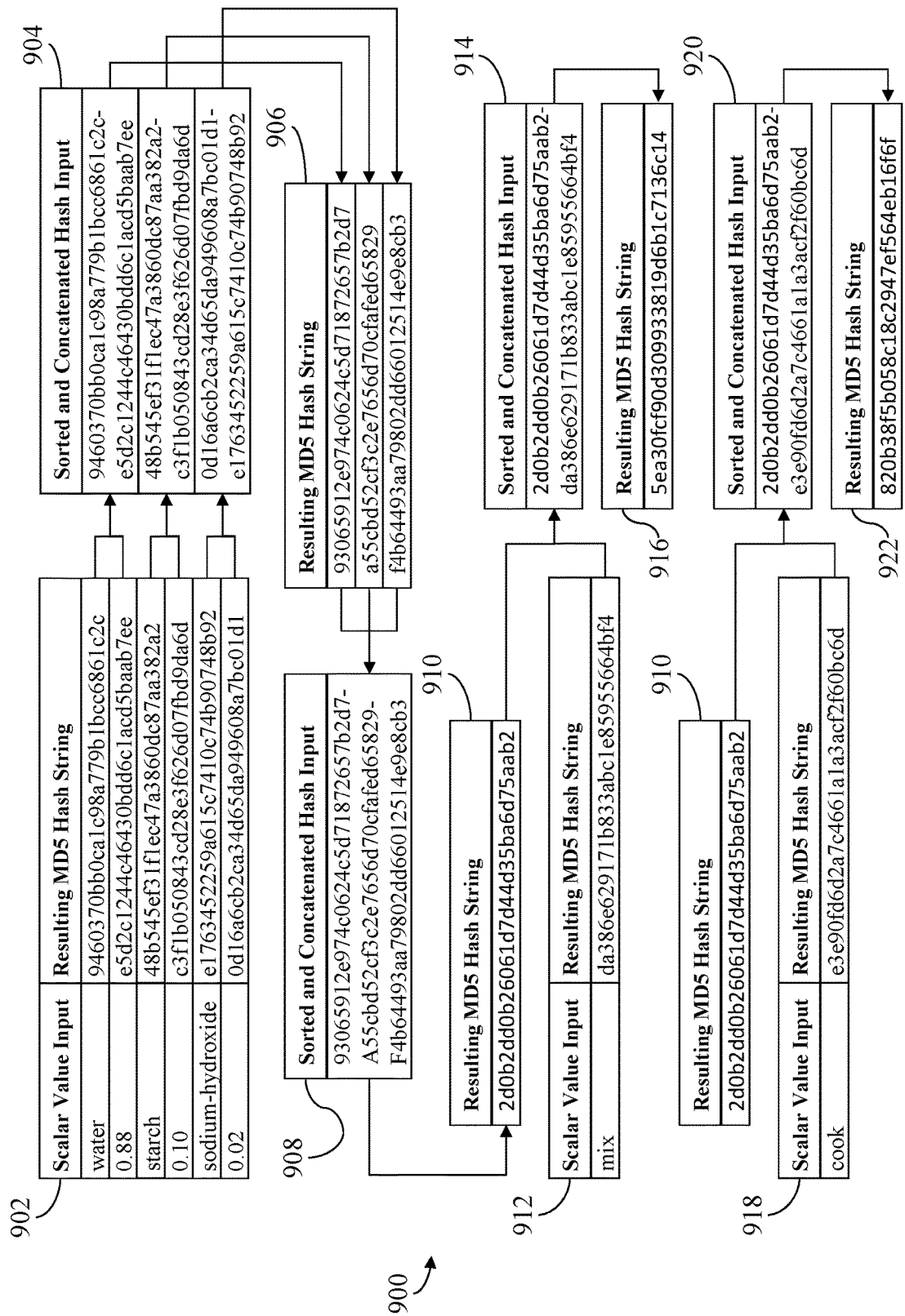
FIG. 9A is a first portion of a flowchart showing exemplary steps that a system could perform to produce EntityKeys.

FIG. 9A is a flowchart showing exemplary steps a system may take to consistently produce EntityKeys. Using the adhesive variant (330) as shown in FIG. 3B as an example, the steps (900) diagram an exemplary hashing sequence provided by the system (10) once a user saves or approves an entity within the system (e.g., an adhesive variant). Scalar input values (e.g., "water"), shown in the left hand column of table (902), may be identified (604) based on user inputs or selections (206) and may be recorded in memory such as a browser or client cache, (108) and (110), or server cache (100). Given only one scalar value (e.g., nothing to sort or order) as an attribute, the system (10) may skip the ordering step (608) and hash (610) each value, using any number of hashing methods (e.g., MD5) with each resulting hash string (e.g., 9460370bb0ca1c98a779b1bcc6861c2c) recorded in memory as previously described. As shown in the adjacent table (904), the resulting (902) hash strings may then be sorted and concatenated (608) by the system (10) using any number of aforementioned ordering principles (e.g., 9460370bb0ca1c98a779b1bcc6861c2c-e5d2c1244c46430bdd6c1acd5baab7ee) and hashed (610), with the resulting hash strings (e.g., 93065912e974c0624c5d71872657b2d7), shown in table (906), stored in memory as previously described. The material ingredient or (906) hashes may then be sorted and concatenated (608) as in table (908), and then hashed (610) by the system (10) to produce a material recipe or (910) hash string which may be committed to memory as previously described. This recipe hash (910) may be sorted and concatenated with hashes of process action scalar values (e.g., hash strings of "mix" (912) and "cook" (918)) previously identified (604) based on user selections and hashed (610) and stored in memory as previously described. These each action hash string may then be sorted and concatenated (608) with the (910) or recipe hash string as shown in (914) and (920), and hashed (610) with each resulting hash string, (916) and (922) respectively, stored in memory as previously described.

Figure 9B:
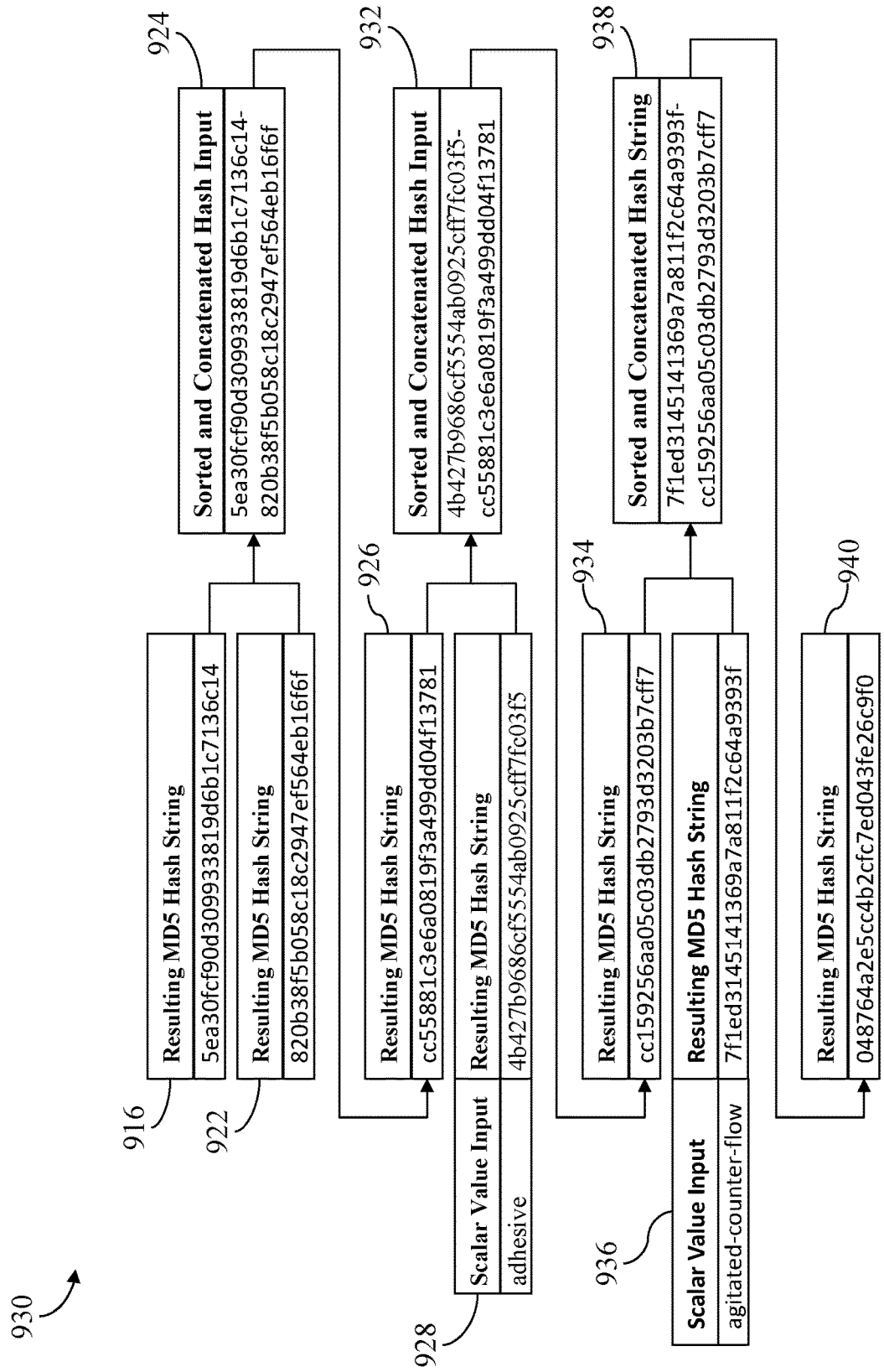
FIG. 9B is a second portion of the flowchart following the first portion of FIG. 9A.

Moving on to FIG. 9B, a continuation of the FIG. 9A flowchart showing (930) additional exemplary steps, the resulting (916) and (922) hash strings may be sorted and concatenated (608) by the system (10) as shown in table (924), and hashed (610) with the resulting hash string (926) recorded in memory as previously described. Note that the (926) hash string may be thought of as a particular variant recipe made up of particular variant ingredients and their corresponding recipe ratios, and particular process actions, with no particular cognate type (e.g., a hash string of the scalar value "adhesive") yet associated. Such an interim EntityKey, which the system (10) may also store in persistent memory such as the cognate specification database (106), as one of the aforementioned base case or shared entity types, may have value in identifying identical variant recipes regardless of their cognate types (e.g., two identical variant recipes, one called an "adhesive" and the other a "suspension") as those skilled in the art will understand in light of this disclosure.

Continuing with the sequence shown (930), the (926) hash may be sorted and concatenated (608) with a previously hashed (610), cognate variant type scalar value hash string (e.g. 4b427b9686cf5554ab0925cff7fc03f5 or hash string of "adhesive") as shown (932), then hashed (610) with the resulting hash string (934) stored in memory as previously described. The resulting hash (934) may then be compared to existing entities in the dataset (e.g., the EntityKeys associated with all existing, approved adhesive variants in the system (10)) which may be queried (612) from the database (106), or the server cache (100), or some cache on the (108) and (110) clients, or some combination thereof, and where the EnityKey exists (614), associate the adhesive variant EntityID (302) the user just approved with existing (328 or 302) EntityKey, and where the EntityKey does not exist (614), write (618) the new EntityKey or (934) hash string to the dataset (106).

Figure 9C:
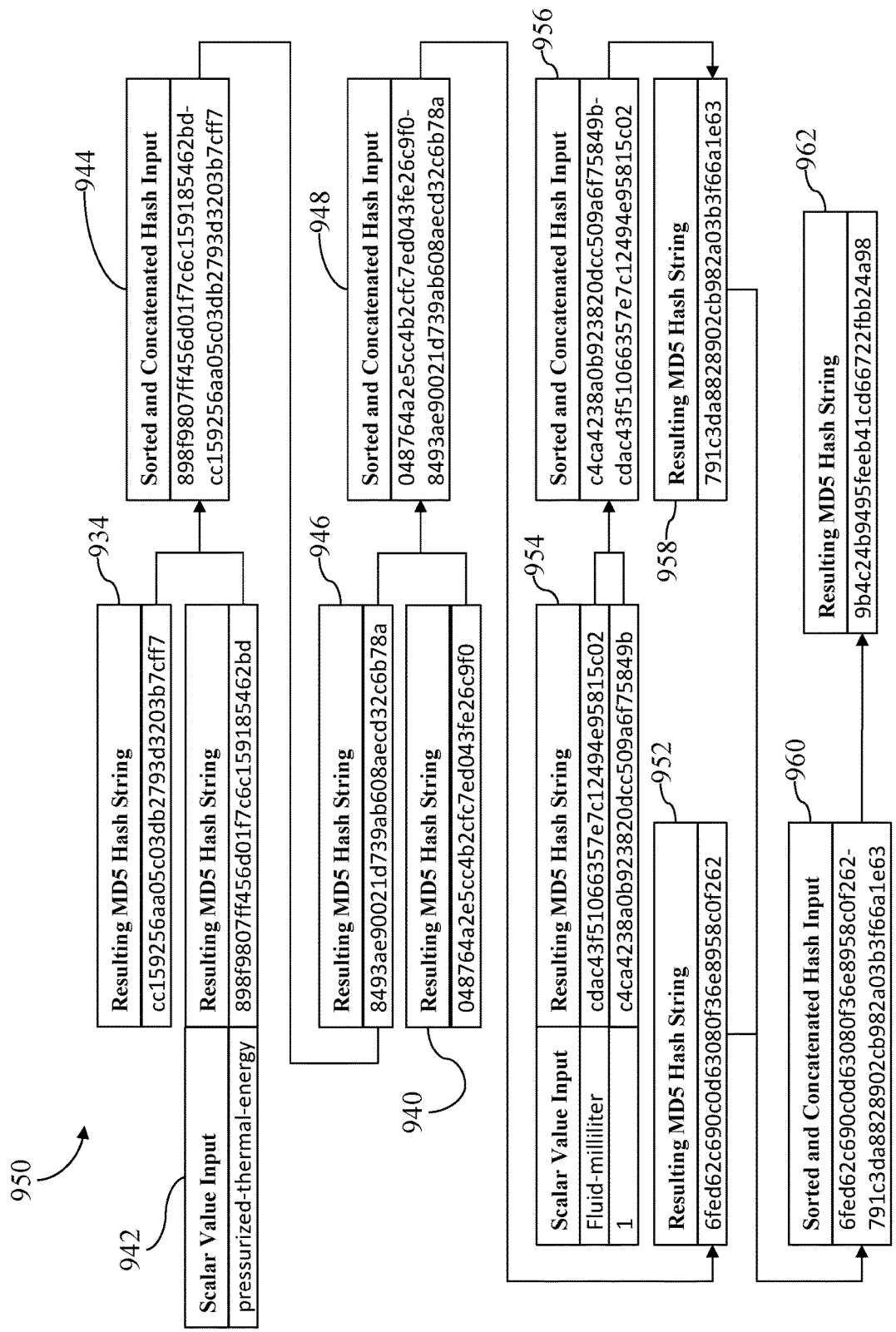
FIG. 9C is a third portion of the flowchart following the second portion of FIG. 9B.

Continuing with FIG. 9B and onto FIG. 9C, the user who approved the above variant, or some other user associated with the same enterprise, or some other user outside the enterprise with whom the approving user has shared the approve variant, may extend the adhesive variant to an adhesive item as shown (930), by selecting (206) one or more required process methods (e.g., given the variant process action "mix", the user may select "agitated-counter-flow" from a list of system (10) constrained process methods, and likewise for "cook" may select "pressurized-thermal-energy") and a unit of measure (e.g., [1] fluid milliliter) or MaterialForm (304) predefined within the system (10). Upon approving the adhesive item, the system (10) may hash (610) the above scalar value inputs as shown in (936), (942), and (954) respectively, then sort and concatenate (608) as shown in (938), (944), (948), (956) and (960) respectively, and hash (610) the combined strings to produce resulting hash strings as shown in (940), (946), (952), (958), and (962) respectively. The material or adhesive item (962) EntityKey may then be queried for and recorded in the same manner as the adhesive variant or (926) EntityKey as described above, albeit against all existing adhesive items (304) instead of adhesive variants (302). As can be seen from the examples above, the system allows a user to select, view, and interact with a variety of predefined entity types, as well as a variety of characteristics, attributes, key value pairs, or other data associated with predefined entities. In this context, key value pairs may be implemented in varying ways, and may include simple integers and strings as the key, value, or both, or may include more complex data such as composite identifiers, entities, objects, or datasets.

The above described hashing techniques, processes, hash values, and other characteristics are examples, and varying implementations of the disclosed technology may include some or all of the disclosed steps in the same or a different order (e.g., sequential order and/or in parallel), and may contain additional steps. Such variations on the hashing techniques described in FIG. 6, FIG. 9A, FIG. 9B and FIG. 9C will be apparent to those of ordinary skill in the art in light of this disclosure.

Figure 7:
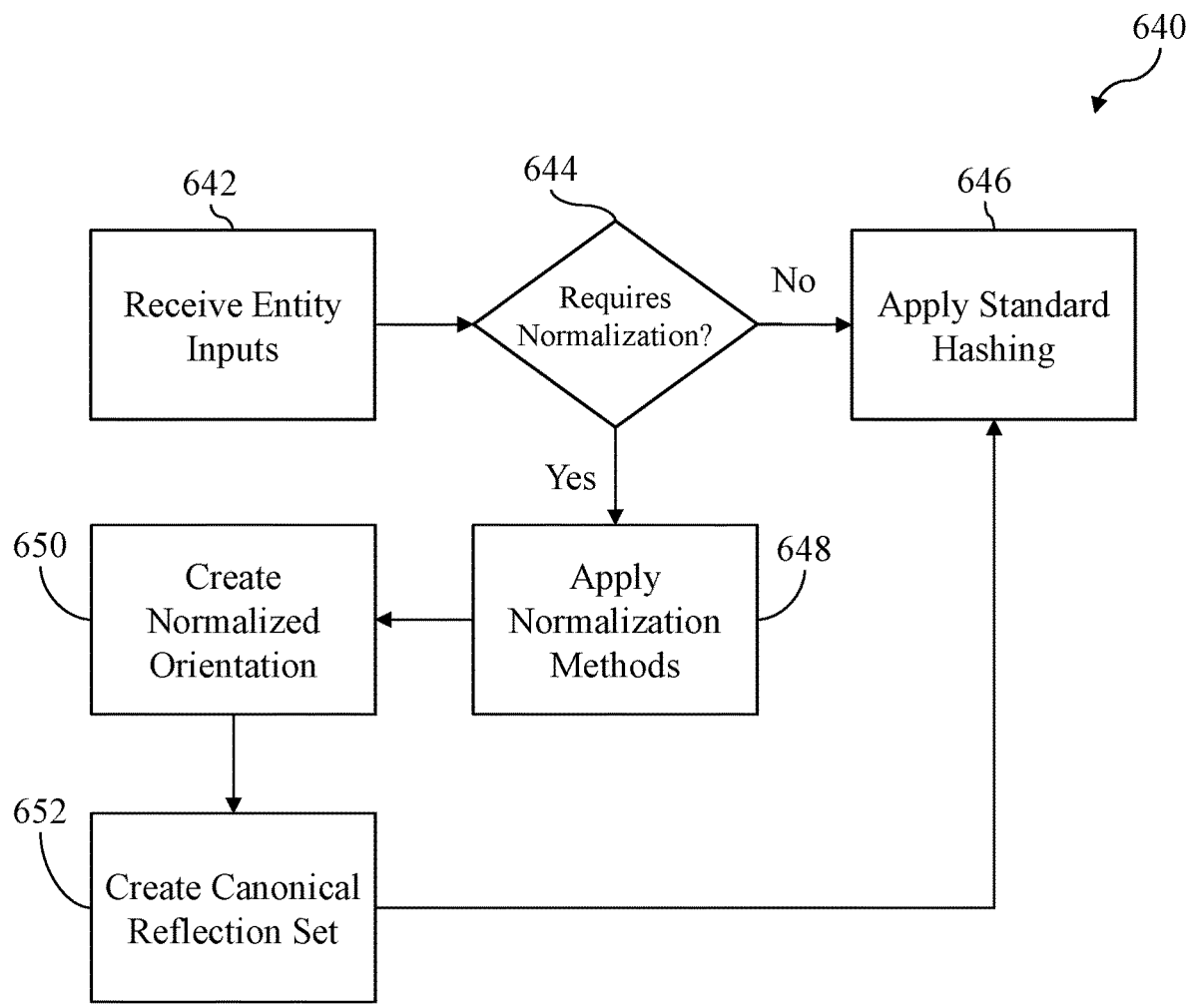
FIG. 7 is a flowchart showing an exemplary set of steps that a system could perform to create canonical representations of entities that include normalization within the cognate specification environment.

FIG. 7 is a flowchart showing an exemplary set of steps that a system may perform to generate canonical identifiers for digital referents (e.g., 2D and 3D structural design variants (308)) that may require normalization techniques during entity creation, editing, saving, and approval, in order to compare their non-trivial attributes (604). When user inputs for specifying an entity are received (642), and where the entity may require normalization (644), steps (640) such as those shown in FIG. 7 may be performed to control for entities that may be duplicates save for variations in the way in which they are oriented in space. Spatial information such as x, y and z coordinate scalar values on Cartesian planes (e.g., [x,y][x,y] coordinates for a line segment (306)) may be included as attributes (604) in the creation of an associated EntityKey (328) for an entity.

For example, if translations, rotations, reflections, and other trivial manipulations of a design variant (e.g., design variant shown in (702)) are not controlled for (e.g., no normalization methods (648) are applied), then its constituent entities' (e.g., line segments (306)) identified (604) scalar values may fluctuate as a result of such manipulations, with each fluctuation producing a different constituent hash string (606), therefore resulting in different combinations of sorted and concatenated hash sets (608), with each combination thereof producing a different EntityKey (610) for what may be the same entity (e.g., a single design variant such as the one shown in (702) simply being shown in different spatial orientations).

Figure 8A:
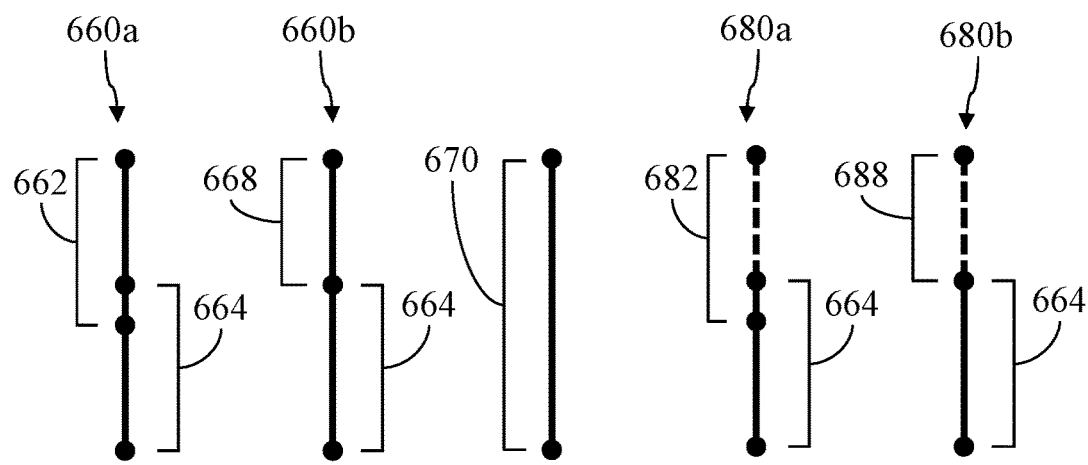
FIG. 8A is a schematic diagram that illustrates several examples of entities throughout a normalization process.

FIG. 8A illustrates several examples associated with normalization methods that may be programmatically employed on the design elements (306) that constitute a design variant such as the one (804) that will be described in more detail below. That figure shows two anomalies (660a, 660b) in which the involved design elements or line segments (662-668) are all of the same LineType (306) and therefore may represent a situation where the drafter of the CAD drawing intended the two line segments to be as one. The first anomaly (660a) is illustrated by two line segments, (662) and (664), that overlap. The second anomaly (660b) is illustrated by two line segments with a common intersection. A system (10) may normalize for the first anomaly (660a) by checking (648) for the overlap, comparing (648) the LineTypes of the two line segments and when equal (648), eliminating (648) all four coordinates and then, using (648) the lower end point of line segment (664) and the upper end point of line segment (662), construct (648) a new, single line segment (670) of the same LineType to replace the two overlapping line segments.

A system (10) may normalize for the second anomaly (660b) in the same or similar fashion by checking for the intersection, eliminating all four coordinates and then, using the lower end point of line segment (664) and the upper end point of line segment (668), to construct a new, single line segment (670) to replace the two intersecting line segments. Shown in (680*a*) is another anomaly in which the two involved design elements (306) or line segments (664) and (682) overlap but are of different LineTypes (306). A system (10) may normalize for this anomaly by comparing (648) the entity LineTypes and upon determining (648) they are different, prompt (648) the drafter for a course of action, which may include choosing (648) to eliminate the lower coordinate of line segment (682) or the upper coordinate of line segment (664). The two line segments (680*b*), (688) and (664), illustrate a result in which the drafter chose the former option, upon which action (648) the system (10) may subsequently eliminate (648) the lower coordinate of line segment (682) and constructed (648) a new lower coordinate to create (648) line segment (688) and set (648) its lower coordinate [x,y] values equal to the upper coordinate [x,y] values of line segment (664). Such anomalies (660*a*, 660*b*, 680*a*, 680*b*) as described above may extend to design elements other than line segments (e.g., arcs, circles, hypersurfaces, vector and pixel graphics, etc.) and when such other design elements require normalization (644), similar normalizing techniques such as those described above may be applied (648) as those skilled in the art will understand in light of this disclosure.

Figure 8B:
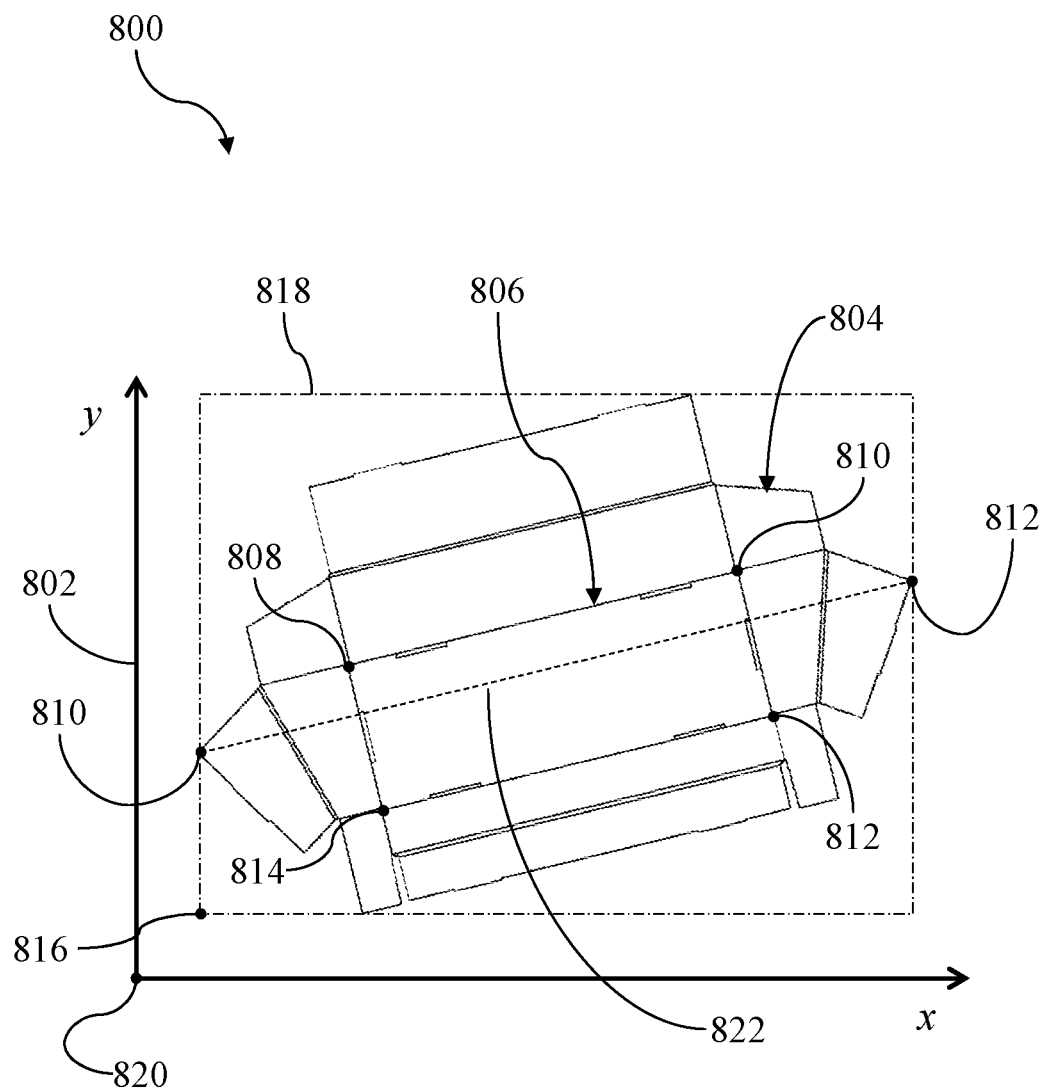
FIG. 8B is a schematic diagram that illustrates an entity during a step of a normalization process.

FIG. 8B is an exemplary illustration that presents various normalization methods (800) that may be programmatically employed on digital referents (e.g., design variants like the one shown in (804)) in order to demonstrate how trivial orientation differences (e.g., rotational and positional variations) in space (e.g., the two-dimensional Cartesian plane as described above and as illustrated in (802)) may be controlled for, such that a system (10) may consistently and reliably identify (604), create (606-610) and compare (612) attributes for entities that may require normalization techniques. For example, a normalization technique may be employed during the creation or editing of an entity to address the various CAD tools a user may employ to draw identical shapes in space (802). To illustrate such a case, the rectangle portion (806) of the design variant shown in (804) may be drawn more than one way.

In a first way, a user may draw it using a CAD polyline or rectangle tool. In a second way, a user may draw it using a CAD line tool. And although the two results may appear the same on the screen, the CAD engine may write each way's corresponding data to file differently. In the first way, the engine may record four [x,y] coordinates, one for each of the four corners (808-814) of the rectangle, as a sequence of vertices. In the second way, it may record eight [x,y] coordinates, two for each line segment (e.g., point (808) to point (810) may form one line segment, point (810) to point (812) another, point (812) to (814) another, and point (814) to (808) may form the final remaining line segment). A normalization method to reduce polygons to their base case elements (e.g., collections of line segments, arcs and circles), such as exploding (648) the first way's four vertices into eight correspond [x,y] coordinates as described in the second way's line segment example above, may provide one in a number of methods (648) employed to normalize certain types of entities. Normalization methods such as those described above may be equally applied in three-dimensional space as those skilled in the art will observe in light of this disclosure.

Continuing with FIG. 8B, other normalization techniques may be employed prior to saving an entity (804) to the database (106) in which the minimum extension (816) or lower, left hand corner of the entity's bounding rectangle (818), with all other entity (804) points on and within the perimeter of the bounding rectangle being locked (648) in relation to the minimum extension, is set (648) to origin (820) or [0,0] with all points included in the entity maintaining (648) their original and non-trivial relation to one another. Upon setting the entity to origin, all new coordinates included in the entity may be calculated (648) based upon the delta (e.g., slope, direction and distance) between (816) and (820) and the new coordinate values (604) used to create (606-610) corresponding EntityKeys (e.g., LineKeys (306)). These corresponding EntityKeys may then be compared (612) against the design elements (306) dataset which may be stored in the database (106), or client memory, or server memory, or some combination thereof, such that all design elements included in the entity (804) that exist (614) may resolve and become referenced (616) to those existing design element EntityIDs (306), or in cases where the EntityKeys (e.g., LineKeys (306)) do not exist (614), new EntityIDs and their associated EntityKeys may be written (618) to the dataset and persistently stored in the database (106). Consistently repositioning entities to a common Cartesian orientation such as the technique described above may be employed as often as needed (e.g., if some other normalization technique performed causes the lower left corner of the bounding rectangle to be moved to a point other than [0,0]) as will be apparent to those skilled in the art in light of this disclosure.

Continuing with FIG. 8B, other normalization techniques may, upon an entity (804) being approved (e.g., freezing or committing an in-process entity such that its inputs can no longer be edited), use one or more characteristics of the entity to manipulate (648) the entity in order to control for rotation and create (650) one or more normalized orientations of that entity. In turn, these one or more normalized orientations may serve as one or more starting points for creating one or more reflection sets (652) as will described in more detail below. Identifying an entity characteristic to be used as a control for rotation may include programmatically scanning (648) all points within an entity (804) and selecting (648) two points such as (810) and (812), that are furthest apart from one another relative to the individual distances (822) between all other two-point sets included in the entity (804). In cases where there is more than one set or pair of points that possess the desired characteristic (e.g., an entity such as (804) that has two, three, four or even more pairs of points with the distance (822) between each pair being of equal length and representing the greatest distance for all such pairs included in the entity), there may be more than one normalized orientation created (650), and each may be used as a starting point for a reflection set normalization technique described below. Using the design variant (804) as a digital referent example, one may observe that there is exactly one set of points contained therein that has a distance (822) between its [x,y] coordinates, (810) and (812), that is greater than any other set or pair of points contained therein, and in this particular case, the entity (804), once rotated in a manner that will be described in detail below, may have only one resulting, normalized orientation (650). The number of normalized orientations created (650) may vary depending upon the entity as those skilled in the art will observe in light of this disclosure.

Figure 8C:
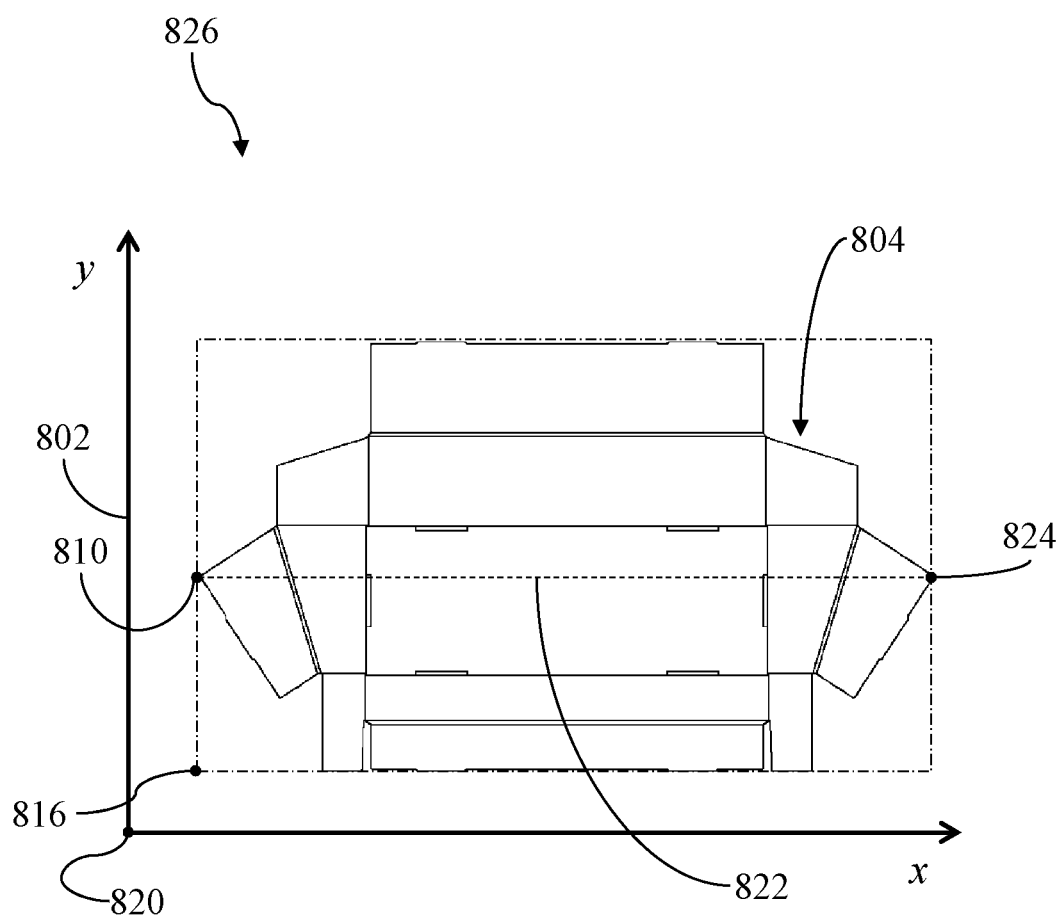
FIG. 8C is a schematic diagram that illustrates an entity during a further step of a normalization process.

Continuing with FIG. 8B, the furthest-points characteristic described above may be employed to rotate (648) a digital referent (804) to its one or more normalized orientations. For example, the imaginary (822) may be used to rotate (648) the entity (804) clockwise or counter clockwise, by pivoting (648) its entirety around one (e.g., (810)) of the two end points of the imaginary line (822), such that the other point (e.g., 812) travels (648) about a circle of (822) radius (648) and comes to rest (648) at a point (824) when its [y] value is equal (648) to the pivot point's [y] value or the imaginary line (822) becomes parallel to the x axis of a Cartesian plane (802) as shown (826) in FIG. 8C. All other points except (810) and (812) included in (804) may travel (648) about their circles with the radius of each point's corresponding circle being equal (648) to the distance (e.g., (822)) between the single pivot point (810) and the other point. Once the normalizing rotation is complete (824), all points included in the entity (804) may be calculated (648) based on their corresponding distance from the pivot point (810) or radius and the distance in radians or degrees traveled around their respective circles in relation to the (812) to (824) circle. Other techniques such as selecting (648) the longest line segment, or some other design element, or some other imaginary characteristic included in a design variant, and performing the same or similar techniques such as those described above in order to control for rotational differences, will be apparent to those skilled in the art in light of this disclosure.

Figure 8D:
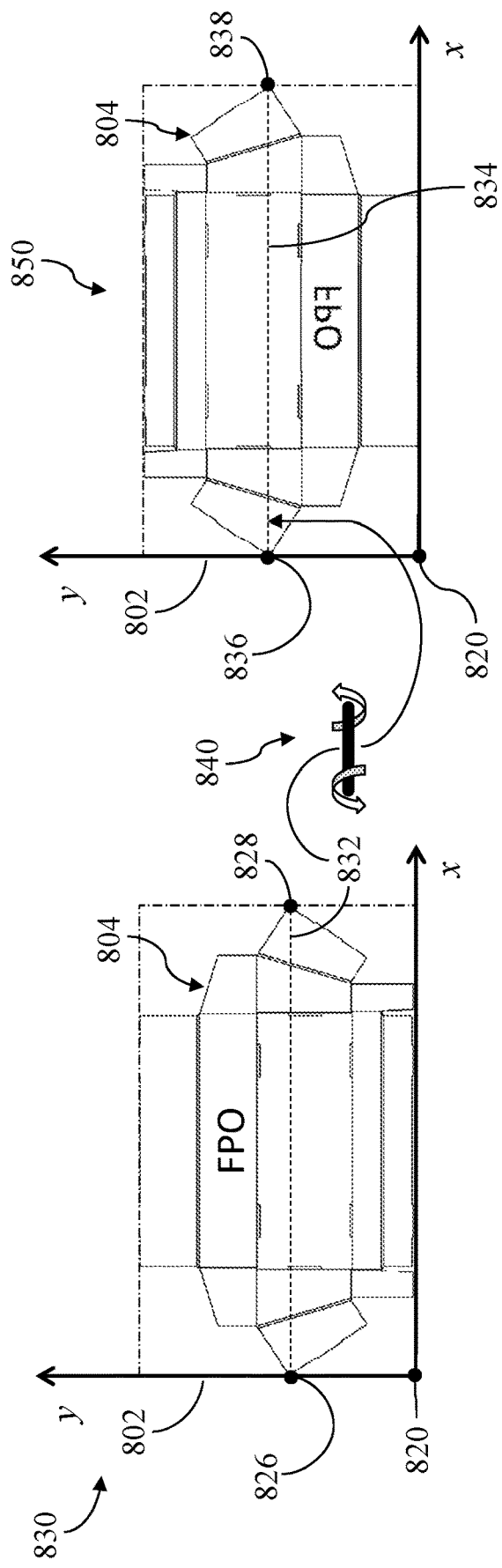
FIG. 8D is a schematic diagram that illustrates an entity during a further step of a normalization process.

FIG. 8D is an exemplary set of illustrations that present how the normalized orientations specified for an entity as described above may be used to create a corresponding reflection set. As an example normalization step 1, the entity (804) as shown in in FIG. 8C, having been rotated to the proper orientation as described in detail above, may be repositioned (648) within the Cartesian plane (802) such that the minimum extension (816) of its bounding rectangle is equal to (648) origin or the intersection of the x and y axes of the Cartesian plane, as shown in (830), thus creating (650) a normalized orientation which may become one of the four reflections of the (804) reflection set (652). The scalar values of all design elements constituting the design variant (804) in this position (830) may be identified (604) and a standard hashing method (646) applied (606-610), such that the database may be queried (612) for all constituent design element EntityKeys associated with the entity (804) in this canonical position (830), and where those hash strings (e.g., LineKey hash strings) exist (614), may be resolved and referenced (616) to the EntityIDs (306), and where they do not exist (614), may be written to the database (618) as new EntityIDs (306), each with its corresponding and newly created EntityKey (e.g., LineKey hash string) also written to the database (618). The collection of design element EntityKeys (306) that make up the entity (804) oriented in this position (830), having been stored in memory as detailed in the FIGS. 9A-C specifications above, may be sorted and concatenated (608) and the resulting string hashed in order to create one of four canonical identifiers (610) that will be combined with the other reflection EntityKeys as will be describe in detail below.

Continuing with FIG. 8D, using the for position only ("FPO") marking to display the result of each subsequent normalization step, as an example normalization step 2, the canonical reflection (830) may be employed to create another of the four canonical reflections (850) by mirroring or flipping the entity (804) in the vertical or rotating it 180° (degrees) in a clockwise or counter clockwise direction (840), using the imaginary line (832) as a horizontal axis, calculating (648) the entity's bounding rectangle minimum extension after such rotation, and moving (648) the entity (804) such that its bounding rectangle's minimum extension is set to origin as detailed above with (822) now shown as (834) and points (826) and (828) now shown as points (836) and (838) respectively, resulting in another (850) of the four reflections that make up the set (652). The scalar values of all design elements constituting the design variant (804) in this position (850), having been stored in memory as detailed in the FIGS. 9A-C specifications above, may be identified (604) and a standard hashing method (646) applied (606-610), such that the dataset may be queried (612) for all constituent design element EntityKeys associated with the entity (804) in this canonical position (650), and where those hash strings (e.g., LineKey hash strings) exist (614), may be resolved and referenced (616) to the EntityIDs (306), and where they do not exist (614), may be written to the database (618) as new EntityIDs (306), each with its corresponding and newly created EntityKey (e.g., LineKey hash string) also written to the database (618). The collection of design element EntityKeys (306) that make up the entity (804) in this canonical position (850), having been stored in memory as detailed in the FIGS. 9A-C specifications above, may be sorted and concatenated (608) and the resulting string hashed in order to create one of four canonical identifiers (610) that will be combined with the other reflection EntityKeys as will be describe in detail below.

Figure 8E:
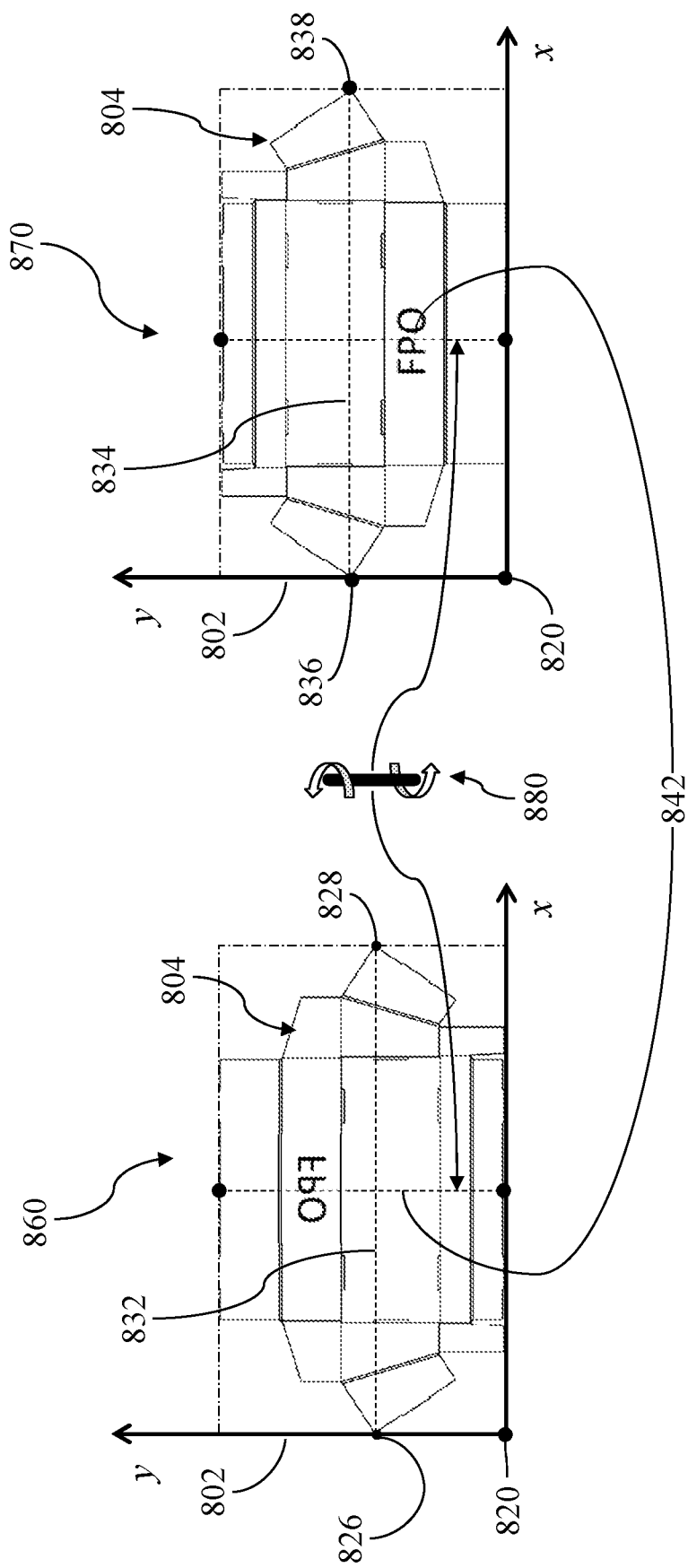
FIG. 8E is a schematic diagram that illustrates an entity during a further step of a normalization process.

FIG. 8E shows, as example normalization steps 3 and 4, how the above two canonical reflections (830) and (850) from FIG. 8D may be employed to create the remaining two canonical reflections (860) and (870), by bisecting (648) their horizontal axes, (832) and (834) respectively, with an imaginary perpendicular line segment (842) and mirroring or flipping each horizontally (648) or rotating each 180° (degrees) in a clockwise or counter clockwise direction (880), using the imaginary line (842) as a vertical axis, calculating (648) each entity's bounding rectangle minimum extension after such rotation, and moving (648) each entity (804) such that their bounding rectangle's minimum extension is set to origin as detailed above, resulting in the remaining two, (860) and (870), of the four reflections that make up the set (652). The scalar values of all design elements constituting the design variant (804) in each position or reflection, (860) and (870), may now be identified (604) and a standard hashing method (646) applied (606-610), such that the dataset may be queried (612) for all constituent design element EntityKeys associated with the entity (804) in each (860) (870) canonical position, and where those hash strings (e.g., LineKey hash strings) exist (614), may be resolved and referenced (616) to the EntityIDs (306), and where they do not exist (614), may be written to the database (618) as new EntityIDs (306), each with its corresponding and newly created EntityKey (e.g., LineKey hash string) also written to the database (618). The collection of design element EntityKeys (306) that make up each (860) (870) reflection of the (804) entity's reflection set (652), having been committed to memory as described in detail as referenced in the FIGS. 9A-C specifications above, may be sorted and concatenated (608) and the resulting string hashed in order to create one of four canonical identifiers (610) that will be combined with the other reflection EntityKeys as will be describe in detail below. The sequence in which the mirroring or flipping takes place (e.g., horizontal first or vertical first) makes no difference in the resulting reflection set as those skilled in the art will understand in light of this disclosure.

All four canonical reflection hash strings having been created as detailed above, and having been committed to memory as described in detail as referenced in the FIGS. 9A-C specifications above, may be sorted and concatenated (608) and the resulting string hashed (610), so that the result or canonical reflection set (652) hash for the entity (804) may be compared (612) against all existing canonical reflection set EntityKeys (328) in the dataset, and where there is a match (614), associate the (804) EntityID (306) with the existing EntityKey, or where there is no match, write the new EntityKey to the database (106) and associate the (804) EntityID with the new EntityKey. By globally enforcing and ensuring de-duplication of design elements (e.g., lines, circles and arcs) across an entire platform as described above, there is a significant improvement in the function of the system that includes both reduced storage requirements and reduced network and communication requirements.

As an example, a CAD drawing associated with a popular style of cardboard box may be commonly shared between and used by thousands of businesses and individuals. Even if the drawing starts from a common file, over time it may be copied by individual users and modified in trivial and non-trivial ways (e.g., it may be translated across the x or y axis, rotated about the x or y axis, scaled to be larger or smaller). In conventional practice, a manufacturer of cardboard boxes may store hundreds or even thousands of files or datasets with many being identical or near duplicates provided.

Implementations of the system disclosed herein may convert data associated with such cardboard boxes (e.g., materials, production processes, etc.) into unique entities which enforces de-duplication of the data, and may also convert the CAD drawings themselves into unique, normalized entities which enforces de-duplication of designs that account for translation, rotation, mirroring, scaling, etc. Such a process may allow the manufacturer to store a single version of a design instead of a hundred or a thousand separate designs to account for each of its customers, greatly reducing the disk storage requirements for such a design and the complexity of manual or automated processes to manage numerous designs. Further, when communication (e.g., between a server and a client, or between other sets of devices) over a network is associated with unique entities such as a design or data associated with the design, such communication can be accomplished with the exchange or transmission of unique entity keys rather than the exchange of data files (e.g., such as a PDF, STL, OBJ, or other file type). As an example, this could reduce network traffic associated with such a communication from several megabytes of data required to transmit computer files associated with a design to a kilobyte or less required to transmit a unique entity key associated with the design.

The following examples relate to various non-exhaustive ways in which the teachings herein may be combined or applied. It should be understood that the following examples are not intended to restrict the coverage of any claims that may be presented at any time in this application or in subsequent filings of this application. No disclaimer is intended. The following examples are being provided for nothing more than merely illustrative purposes. It is contemplated that the various teachings herein may be arranged and applied in numerous other ways. It is also contemplated that some variations may omit certain features referred to in the below examples. Therefore, none of the aspects or features referred to below should be deemed critical unless otherwise explicitly indicated as such at a later date by the inventors or by a successor in interest to the inventors. If any claims are presented in this application or in subsequent filings related to this application that include additional features beyond those referred to below, those additional features shall not be presumed to have been added for any reason relating to patentability.

Example 1

A method for managing cognate specifications comprising: (a) at a server comprising one or more processors, delivering from an existing entity dataset, a set of first predefined entity types; (b) receiving a selection of a first predefined entity type from the set of first predefined entity types to create a provisional entity based on the first predefined entity type; (c) transmitting a first set of existing key value pairs from the existing entity dataset, based on the first predefined entity type, wherein each existing key value pair in the first set of key value pairs consists of an existing entity and an existing composite identifier; (e) receiving selections of key value pairs from the first set of key value pairs to create a second set of key value pairs that specifies the provisional entity; (f) receiving the existing composite identifier from each key value pair in the second set of key value pairs; (g) sorting and concatenating the existing composite identifiers to create a provisional entity identifier string; (h) creating a provisional entity composite identifier based on the provisional entity identifier string; (i) pairing the provisional entity and the provisional entity composite identifier to create a provisional entity key value pair; (j) querying the existing entity dataset to determine if the provisional entity composite identifier is identical to any existing composite identifier within the existing entity dataset; (k) where the provisional entity composite identifier is identical to an existing composite identifier within the existing entity dataset, replacing the provisional entity key value pair with an existing key value pair, from the existing entity dataset, that is associated with the existing composite identifier; and (l) where the provisional entity composite identifier is not identical to any existing composite identifier within the existing entity dataset, adding the provisional entity key value pair to the existing entity dataset wherein it becomes a new existing key value pair.

Example 2

The method of Example 1, further comprising, where: (i) the provisional entity composite identifier is identical to an existing composite identifier within the existing entity dataset, and (ii) the provisional entity is configured as a user specific entity, adding the provisional entity to the dataset and pairing it with the existing composite identifier to create a new user specific key value pair.

Example 3

The method of any one or more of Examples 1 through 2, wherein the provisional entity composite identifier uniquely identifies an instance of the first predefined entity type.

Example 4

The method of Example 3, wherein the instance references another instance.

Example 5

The method of any one or more of Examples 3 through 4, wherein the instance references a set of instances.

Example 6

The method of any one or more of Examples 3 through 5, further comprising displaying a graphical user interface that allows a user to select and view the instance from the existing entity dataset as an accessible instance, wherein the accessible instance was either created by the user or shared with the user by another user.

Example 7

The method of any one or more of Examples 3 through 6, further comprising displaying a graphical user interface that allows a user to create the instance by inputting, as inputs of a set of inputs, an accessible instance that was either created by the user or shared with the user by another user.

Example 8

The method of any one or more of Examples 3 through 7, further comprising: (a) displaying a graphical user interface that allows a user to provide a computer aided design file; and (b) creating the instance based upon the computer aided design file.

Example 9

The method of Example 8, wherein the first predefined entity type is a composite design entity type, the method further comprising, before creating the provisional entity key value pair, normalizing the instance by: (a) reducing the instance to a set of base case design entity type instances; and (b) correcting anomalies present within the set of base case design entity type instances.

Example 10

The method of Example 9, wherein the first predefined entity type is a composite design entity type, the method further comprising, before creating the provisional entity key value pair, normalizing the instance by: (a) rotating and repositioning the instance to a rotated and repositioned Cartesian orientation; (b) producing an instance reflection set based on the repositioned Cartesian orientation, wherein the instance reflection set includes four canonical Cartesian orientations; (c) creating a first set of base case design entity type instances for the first canonical Cartesian orientation; (d) creating a second set of base case design entity type instances from the second canonical Cartesian orientation; (e) creating a third set of base case design entity type instances from the third canonical Cartesian orientation; (f) creating a fourth set of base case design entity type instances for the fourth canonical Cartesian orientation; (g) sorting and concatenating the composite identifiers from each base case entity type instance's key value pair in the first set of base case design entity instance to create a first composite identifier string for the first canonical Cartesian orientation; (h) sorting and concatenating the composite identifiers from each base case entity type instance's key value pair in the second set of base case design entity instance to create a second composite identifier string for the second canonical Cartesian orientation; (i) sorting and concatenating the composite identifiers from each base case entity type instance's key value pair in the third set of base case design entity instance to create a third composite identifier string for the third canonical Cartesian orientation; (j) sorting and concatenating the composite identifiers from each base case entity type instance's key value pair in the fourth set of base case design entity instance to create a fourth composite identifier string for the fourth canonical Cartesian orientation; (k) creating a first composite identifier from the first composite identifier string; (l) creating a second composite identifier from the second composite identifier string; (m) creating a third composite identifier from the third composite identifier string; (n) creating a fourth composite identifier from the fourth composite identifier string; (o) sorting and concatenating the first, second, third and fourth composite identifiers to create an instance reflection set composite identifier string; and (p) creating a canonical provisional composite identifier based on the instance reflection set composite identifier string.

Example 11

The method of Example 10, further comprising rotating and repositioning the instance to a rotated and repositioned Cartesian orientation a plurality of times.

Example 12

The method of any one or more of Examples 1 through 11, further comprising requiring that a same ordering principle be used for all users of the server when sorting and concatenating the existing composite identifiers to create the provisional entity identifier string.

Example 13

The method of any one or more of Examples 1 through 12, wherein the provisional entity composite identifier comprises a scalar value.

Example 14

The method of any one or more of Examples 1 through 13, wherein the provisional entity composite identifier comprises a set of scalar values.

Example 15

The method of any one or more of Examples 1 through 14, wherein the provisional entity composite identifier comprises a hash of a scalar value, the method further comprising requiring that a same hashing method be used in the creation of all hashes.

Example 16

The method of any one or more of Examples 1 through 15, wherein the provisional entity composite identifier comprises a hash of a set of scalar values, the method further comprising requiring that a same hashing method be used in the creation of all hashes.

Example 17

The method of any one or more of Examples 1 through 16, wherein the provisional entity composite identifier comprises a hash of an aggregate string of a plurality of hashes, the method further comprising requiring that a same hashing method be used in the creation of all hashes.

Example 18

The method of any one or more of Examples 1 through 17, further comprising: (a) storing an existing entity in the existing entity dataset as a mutable entity with an second set of existing key value pairs being editable; and (b) upon receiving an approval for the existing entity from a user, storing the existing entity in the existing data set as an immutable entity with the second set of existing key value pairs no longer being editable.

Example 19

The method of any one or more of Examples 1 through 18, wherein the set of first predefined entity types comprises a plurality of base case design entity types including: (a) a two-dimensional point entity type; (b) a three-dimensional point entity type; (c) a line entity type; (d) a circle entity type; (e) an arc entity type; (f) a hypersurface entity type; (g) a pixel entity type; (h) a solid fill area entity type; (i) a gradient fill area entity type; and (j) a pixel fill area entity type.

Example 20

The method of any one or more of Examples 1 through 19, wherein the set of first predefined entity types comprises a plurality of composite design entity types including: (a) a two-dimensional structural entity type; (b) a two-dimensional graphic entity type; (c) a three-dimensional structural entity type; and (d) a three-dimensional graphic entity type.

Example 21

The method of any one or more of Examples 1 through 20, wherein the set of first predefined entity types comprises a plurality of physical object template entity types including: (a) a material variant entity type; (b) a component variant entity type; and (c) an aggregate variant entity type.

Example 22

The method of any one or more of Examples 1 through 21, wherein the set of first predefined entity types comprises a plurality of physical object entity types including: (a) a material item entity type; (b) a component item entity type; and (c) an aggregate item entity type.

Example 23

The method of any one or more of Examples 1 through 22, wherein the set of first predefined entity types comprises a plurality of physical process entity types including: (a) a material process entity type; (b) a component process entity type; and (c) an aggregate process entity type.

Example 24

The method of any one or more of Examples 1 through 23, wherein the set of first predefined entity types comprises a plurality of digital object template types including: (a) a quote profile entity type; and (b) a quote entity type.

Example 25

A method for managing cognate specifications for a plurality of users comprising: (a) at one or more processors, receiving a set of inputs from a user of the plurality of users that describes a set of characteristics of an entity; (b) creating a set of unique identifiers based upon the set of characteristics; (c) sorting and concatenating the set of unique identifiers to produce an identifier string; (d) creating a composite entity key based upon the identifier string, wherein the composite entity key is uniquely associated with: (i) the entity, and (ii) any other entity having characteristics identical to the set of characteristics; (e) querying an entity dataset to determine if the composite entity key is already present within the entity dataset; (f) where the composite entity key is present within the dataset, replacing the entity with a pre-existing entity that associated with the composite entity key; (g) where the composite entity key is not present within the entity dataset, adding the entity and the composite entity key to the entity dataset; and (h) in response to a request from the user indicating that the entity should be shared with a recipient, allowing the recipient to view the entity on a display.

Example 26

The method of Example 25, wherein each identifier of the set of unique identifiers comprises a hash value that corresponds to the characteristic associated with that identifier, the method further comprising, when sorting and concatenating the set of unique identifiers to produce the identifier string: (a) identifying a plurality of attribute sets based on the set of characteristics, wherein each attribute set comprises a key and a value associated with one characteristic; (b) producing a plurality of attribute hashes based on the plurality of attribute sets; (c) sorting the plurality of attribute hashes using an ordering principle to produce an ordered attribute hash set; and (d) producing the identifier string based on the ordered attribute hash set.

Example 27

The method of Example 26, further comprising, with the one or more processors, requiring that the same ordering principle be used for every user of the plurality of users when producing the hash string.

Example 28

The method of any one or more of Examples 25 through 27, with the one or more processors and when the entity describes a digital referent: (a) normalizing the digital referent by: (i) automatically correcting line anomalies present in the digital referent; and (ii) automatically reducing the digital referent into a set of base elements, wherein the set of base elements consists essentially of one or more lines, one or more arcs, and one or more circles; and (b) updating the set of characteristics based on the normalized digital referent prior to creating the set of unique identifiers based upon the set of characteristics.

Example 29

The method of Example 28, further comprising normalizing the digital referent by: (a) rotating and repositioning the digital referent to a Cartesian orientation; (b) producing a reflection set based on the rotated and repositioned digital referent, wherein the reflection set includes four variations on the digital referent; and (c) creating the set of unique identifiers based upon the set of characteristics and the reflection set.

Example 30

A system for managing cognate specifications for a plurality of users comprising one or more processors configured to: (a) receive a set of inputs from a user of the plurality of users that describes a set of characteristics of an entity; (b) create a set of unique identifiers based upon the set of characteristics; (c) sort and concatenate the set of unique identifiers to produce an identifier string; (d) create a composite entity key based upon the identifier string, wherein the composite entity key is uniquely associated with: (i) the entity, and (ii) any other entity having characteristics identical to the set of characteristics; (e) query an entity dataset to determine if the composite entity key is already present within the entity dataset; (f) where the composite entity key is present within the dataset, replace the entity with a pre-existing entity that associated with the composite entity key; (g) where the composite entity key is not present within the entity dataset, add the entity and the composite entity key to the entity dataset; and (h) in response to a request from the user indicating that the entity should be shared with a recipient, allow the recipient to view the entity on a display.

It should be understood that any one or more of the teachings, expressions, embodiments, examples, etc. described herein may be combined with any one or more of the other teachings, expressions, embodiments, examples, etc., that are described herein. The following described teachings, expressions, embodiments, examples, etc. should therefore not be viewed in isolation relative to each other. Various suitable ways in which the teachings herein may be combined will be readily apparent to those of ordinary skill in the art in view of the teachings herein. Such modifications and variations are intended to be included within the scope of the claims.

Having shown and described various embodiments of the present invention, further adaptations of the methods and systems described herein may be accomplished by appropriate modifications by one of ordinary skill in the art without departing from the scope of the present invention. Several of such potential modifications have been mentioned, and others will be apparent to those skilled in the art. For instance, the examples, embodiments, geometrics, materials, dimensions, ratios, steps, and the like discussed above are illustrative and are not required. Accordingly, the scope of the present invention should be considered in terms of the following claims and is understood not to be limited to the details of structure and operation shown and described in the specification and drawings.

The invention claimed is:

1. A method for managing cognate specifications comprising:
   (a) at a server comprising one or more processors, delivering from an existing entity dataset, a set of first predefined entity types;
   (b) receiving a selection of a first predefined entity type from the set of first predefined entity types to create a provisional entity based on the first predefined entity type;
   (c) transmitting a first set of existing key value pairs from the existing entity dataset, based on the first predefined entity type, wherein each existing key value pair in the first set of key value pairs consists of an existing entity and an existing composite identifier;
   (e) receiving selections of key value pairs from the first set of key value pairs to create a second set of key value pairs that specifies the provisional entity;
   (f) receiving the existing composite identifiers from each key value pair in the second set of key value pairs;
   (g) sorting and concatenating the existing composite identifiers to create a provisional entity identifier string;
   (h) creating a provisional entity composite identifier based on the provisional entity identifier string;
   (i) pairing the provisional entity and the provisional entity composite identifier to create a provisional entity key value pair;
   (j) querying the existing entity dataset to determine if the provisional entity composite identifier is identical to any existing composite identifier within the existing entity dataset;
   (k) where the provisional entity composite identifier is identical to an existing composite identifier within the existing entity dataset, replacing the provisional entity key value pair with an existing key value pair, from the existing entity dataset, that is associated with that existing composite identifier; and
   (l) where the provisional entity composite identifier is not identical to any existing composite identifier within the existing entity dataset, adding the provisional entity key value pair to the existing entity dataset wherein it becomes a new existing key value pair.

2. The method of claim 1, further comprising, where:
   (i) the provisional entity composite identifier is identical to the existing composite identifier within the existing entity dataset, and
   (ii) the provisional entity is configured as a user specific entity,
   adding the provisional entity to the dataset and pairing it with that existing composite identifier to create a new user specific key value pair.

3. The method of claim 1, wherein the provisional entity composite identifier uniquely identifies an instance of the first predefined entity type.

4. The method of claim 3, wherein the instance references another instance.

5. The method of claim 3, wherein the instance references a set of instances.

6. The method of claim 3, further comprising displaying a graphical user interface that allows a user to select and view the instance from the existing entity dataset as an accessible instance, wherein the accessible instance was either created by the user or shared with the user by another user.

7. The method of claim 3, further comprising displaying a graphical user interface that allows a user to create the instance by inputting, as inputs of a set of inputs, an accessible instance that was either created by the user or shared with the user by another user.

8. The method of claim 3, further comprising:
   (a) displaying a graphical user interface that allows a user to provide a computer aided design file; and
   (b) creating the instance based upon the computer aided design file.

9. The method of claim 8, wherein the first predefined entity type is a composite design entity type, the method further comprising, before creating the provisional entity key value pair, normalizing the instance by:
   (a) reducing the instance to a set of base case design entity type instances; and
   (b) correcting anomalies present within the set of base case design entity type instances.

10. The method of claim 9, wherein the first predefined entity type is a composite design entity type, the method further comprising, before creating the provisional entity key value pair, normalizing the instance by:
    (a) rotating and repositioning the instance to a rotated and repositioned Cartesian orientation;

(b) producing an instance reflection set based on the repositioned Cartesian orientation, wherein the instance reflection set includes four canonical Cartesian orientations;

(c) creating a first set of base case design entity type instances for the first canonical Cartesian orientation;

(d) creating a second set of base case design entity type instances from the second canonical Cartesian orientation;

(e) creating a third set of base case design entity type instances from the third canonical Cartesian orientation;

(f) creating a fourth set of base case design entity type instances for the fourth canonical Cartesian orientation;

(g) sorting and concatenating the composite identifiers from each base case entity type instance's key value pair in the first set of base case design entity instance to create a first composite identifier string for the first canonical Cartesian orientation;

(h) sorting and concatenating the composite identifiers from each base case entity type instance's key value pair in the second set of base case design entity instance to create a second composite identifier string for the second canonical Cartesian orientation;

(i) sorting and concatenating the composite identifiers from each base case entity type instance's key value pair in the third set of base case design entity instance to create a third composite identifier string for the third canonical Cartesian orientation;

(j) sorting and concatenating the composite identifiers from each base case entity type instance's key value pair in the fourth set of base case design entity instance to create a fourth composite identifier string for the fourth canonical Cartesian orientation;

(k) creating a first composite identifier from the first composite identifier string;

(l) creating a second composite identifier from the second composite identifier string;

(m) creating a third composite identifier from the third composite identifier string;

(n) creating a fourth composite identifier from the fourth composite identifier string;

(o) sorting and concatenating the first, second, third and fourth composite identifiers to create an instance reflection set composite identifier string; and (p) creating a canonical provisional composite identifier based on the instance reflection set composite identifier string.

11. The method of claim 10, further comprising rotating and repositioning the instance to a rotated and repositioned Cartesian orientation a plurality of times.

12. The method of claim 1, further comprising requiring that a same ordering principle be used for all users of the server when sorting and concatenating the existing composite identifiers to create the provisional entity identifier string.

13. The method of claim 1, wherein the provisional entity composite identifier comprises a scalar value.

14. The method of claim 1, wherein the provisional entity composite identifier comprises a set of scalar values.

15. The method of claim 1, wherein the provisional entity composite identifier comprises a hash of a scalar value, the method further comprising requiring that a same hashing method be used in the creation of all hashes.

16. The method of claim 1, wherein the provisional entity composite identifier comprises a hash of a set of scalar values, the method further comprising requiring that a same hashing method be used in the creation of all hashes.

17. The method of claim 1, wherein the provisional entity composite identifier comprises a hash of an aggregate string of a plurality of hashes, the method further comprising requiring that a same hashing method be used in the creation of all hashes.

18. The method of claim 1, further comprising:
(a) storing an existing entity in the existing entity dataset as a mutable entity with a second set of existing key value pairs being editable; and
(b) upon receiving an approval for the existing entity from a user, storing the existing entity in the existing entity dataset as an immutable entity with the second set of existing key value pairs no longer being editable.

19. The method of claim 1, wherein the set of first predefined entity types comprises a plurality of base case design entity types including:
(a) a two-dimensional point entity type;
(b) a three-dimensional point entity type;
(c) a line entity type;
(d) a circle entity type;
(e) an arc entity type;
a hypersurface entity type;
(g) a pixel entity type;
(h) a solid fill area entity type;
(i) a gradient fill area entity type; and
(j) a pixel fill area entity type.

20. The method of claim 1, wherein the set of first predefined entity types comprises a plurality of composite design entity types including:
(a) a two-dimensional structural entity type;
(b) a two-dimensional graphic entity type;
(c) a three-dimensional structural entity type; and
(d) a three-dimensional graphic entity type.

21. The method of claim 1, wherein the set of first predefined entity types comprises a plurality of physical object template entity types including:
(a) a material variant entity type;
(b) a component variant entity type; and
(c) an aggregate variant entity type.

22. The method of claim 1, wherein the set of first predefined entity types comprises a plurality of physical object entity types including:
(a) a material item entity type;
(b) a component item entity type; and
(c) an aggregate item entity type.

23. The method of claim 1, wherein the set of first predefined entity types comprises a plurality of physical process entity types including:
(a) a material process entity type;
(b) a component process entity type; and
(c) an aggregate process entity type.

24. The method of claim 1, wherein the set of first predefined entity types comprises a plurality of digital object template types including:
(a) a quote profile entity type; and
(b) a quote entity type.

25. A method for managing cognate specifications for a plurality of users comprising:
(a) at one or more processors, receiving a set of inputs from a user of the plurality of users that describes a set of characteristics of an entity;
(b) creating a set of unique identifiers based upon the set of characteristics;
(c) sorting and concatenating the set of unique identifiers to produce an identifier string;

(d) creating a composite entity key based upon the identifier string, wherein the composite entity key is uniquely associated with:
  (i) the entity, and
  (ii) any other entity having characteristics identical to the set of characteristics;
(e) querying an entity dataset to determine if the composite entity key is already present within the entity dataset;
(f) where the composite entity key is present within the entity dataset, replacing the entity with a pre-existing entity, from the entity dataset, that is associated with the composite entity key;
(g) where the composite entity key is not present within the entity dataset, adding the entity and the composite entity key to the entity dataset; and
(h) in response to a request from the user indicating that the entity should be shared with a recipient, allowing the recipient to view the entity on a display.

26. The method of claim 25, wherein each identifier of the set of unique identifiers comprises a hash value that corresponds to the characteristic associated with that identifier, the method further comprising, when sorting and concatenating the set of unique identifiers to produce the identifier string:
  (a) identifying a plurality of attribute sets based on the set of characteristics, wherein each attribute set comprises a key and a value associated with one characteristic;
  (b) producing a plurality of attribute hashes based on the plurality of attribute sets;
  (c) sorting the plurality of attribute hashes using an ordering principle to produce an ordered attribute hash set; and
  (d) producing the identifier string based on the ordered attribute hash set.

27. The method of claim 26, further comprising, with the one or more processors, requiring that the same ordering principle be used for every user of the plurality of users when producing the hash string.

28. The method of claim 25, further comprising, with the one or more processors and when the entity describes a digital referent:
  (a) normalizing the digital referent by:
    (i) automatically correcting line anomalies present in the digital referent; and
    (ii) automatically reducing the digital referent into a set of base elements, wherein the set of base elements consists essentially of one or more lines, one or more arcs, and one or more circles; and
  (b) updating the set of characteristics based on the normalized digital referent prior to creating the set of unique identifiers based upon the set of characteristics.

29. The method of claim 28, further comprising normalizing the digital referent by:
  (a) rotating and repositioning the digital referent to a Cartesian orientation;
  (b) producing a reflection set based on the rotated and repositioned digital referent, wherein the reflection set includes four variations on the digital referent; and
  (c) creating the set of unique identifiers based upon the set of characteristics and the reflection set.

30. A system for managing cognate specifications for a plurality of users comprising one or more processors configured to:
  (a) receive a set of inputs from a user of the plurality of users that describes a set of characteristics of an entity;
  (b) create a set of unique identifiers based upon the set of characteristics;
  (c) sort and concatenate the set of unique identifiers to produce an identifier string;
  (d) create a composite entity key based upon the identifier string, wherein the composite entity key is uniquely associated with:
    (i) the entity, and
    (ii) any other entity having characteristics identical to the set of characteristics;
  (e) query an entity dataset to determine if the composite entity key is already present within the entity dataset;
  (f) where the composite entity key is present within the entity dataset, replace the entity with a pre-existing entity, from the entity dataset, that is associated with the composite entity key;
  (g) where the composite entity key is not present within the entity dataset, add the entity and the composite entity key to the entity dataset; and
  (h) in response to a request from the user indicating that the entity should be shared with a recipient, allow the recipient to view the entity on a display.

* * * * *